United States Patent
Iida et al.

(10) Patent No.: US 8,671,561 B2
(45) Date of Patent: Mar. 18, 2014

(54) SUBSTRATE MANUFACTURING METHOD

(75) Inventors: Kiyoaki Iida, Nagano (JP); Kazuo Tanaka, Nagano (JP); Hideaki Sakaguchi, Nagano (JP); Mitsutoshi Higashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 1043 days.

(21) Appl. No.: 12/126,306

(22) Filed: May 23, 2008

(65) Prior Publication Data

US 2008/0301935 A1 Dec. 11, 2008

(30) Foreign Application Priority Data

May 24, 2007 (JP) ................................. 2007-137940
Sep. 4, 2007 (JP) ................................. 2007-229424

(51) Int. Cl.
*H05K 3/34* (2006.01)

(52) U.S. Cl.
USPC ...... 29/840; 29/740; 228/180.21; 228/180.22

(58) Field of Classification Search
USPC .................. 29/740, 840; 228/180.21, 180.22
See application file for complete search history.

(56) References Cited

U.S. PATENT DOCUMENTS

| | | | | |
|---|---|---|---|---|
| 5,284,287 A | * | 2/1994 | Wilson et al. | 228/180.22 |
| 5,445,313 A | * | 8/1995 | Boyd et al. | 228/248.1 |
| 5,467,913 A | * | 11/1995 | Namekawa et al. | 228/41 |
| 5,680,984 A | * | 10/1997 | Sakemi | 228/246 |
| 5,687,901 A | * | 11/1997 | Hoshiba et al. | 228/246 |
| 5,695,667 A | * | 12/1997 | Eguchi et al. | 219/388 |
| 5,890,283 A | * | 4/1999 | Sakemi et al. | 29/840 |
| 6,268,275 B1 | * | 7/2001 | Cobbley et al. | 438/612 |
| 7,475,803 B2 | * | 1/2009 | Sumita et al. | 228/246 |
| 2003/0110626 A1 | * | 6/2003 | Cobbley et al. | 29/840 |
| 2006/0157540 A1 | * | 7/2006 | Sumita et al. | 228/180.22 |

FOREIGN PATENT DOCUMENTS

| | | |
|---|---|---|
| JP | 02-102538 | 4/1990 |
| JP | 09-162533 | 6/1997 |
| JP | 9-162533 | 6/1997 |
| JP | 10-074768 | 3/1998 |
| JP | 2003-100789 | 4/2003 |
| JP | 2006-5276 | 1/2006 |

* cited by examiner

*Primary Examiner* — Carl Arbes

(74) *Attorney, Agent, or Firm* — Drinker Biddle & Reath LLP

(57) ABSTRACT

A substrate manufacturing apparatus 100 has a substrate delivery path 120 through which a multi-unit substrate 110 is delivered and a mask delivery path 140 through which an individual mask 130 is delivered. The substrate delivery path 120 has a pad detecting device 160 for detecting a position of a pad 112 formed on a surface of the substrate 110. The mask delivery path 140 has a mask hole detecting device 220 for detecting a position of a conductive ball inserting hole 132 of the individual mask 130. A moving position of an adsorbing head 212 is adjusted in such a manner that the position of the conductive ball inserting hole 132 is coincident with that of the pad 112 of the substrate 110 based on pad position information of the pad detecting device 160 and mask hole position information of the mask hole detecting device 220.

10 Claims, 30 Drawing Sheets

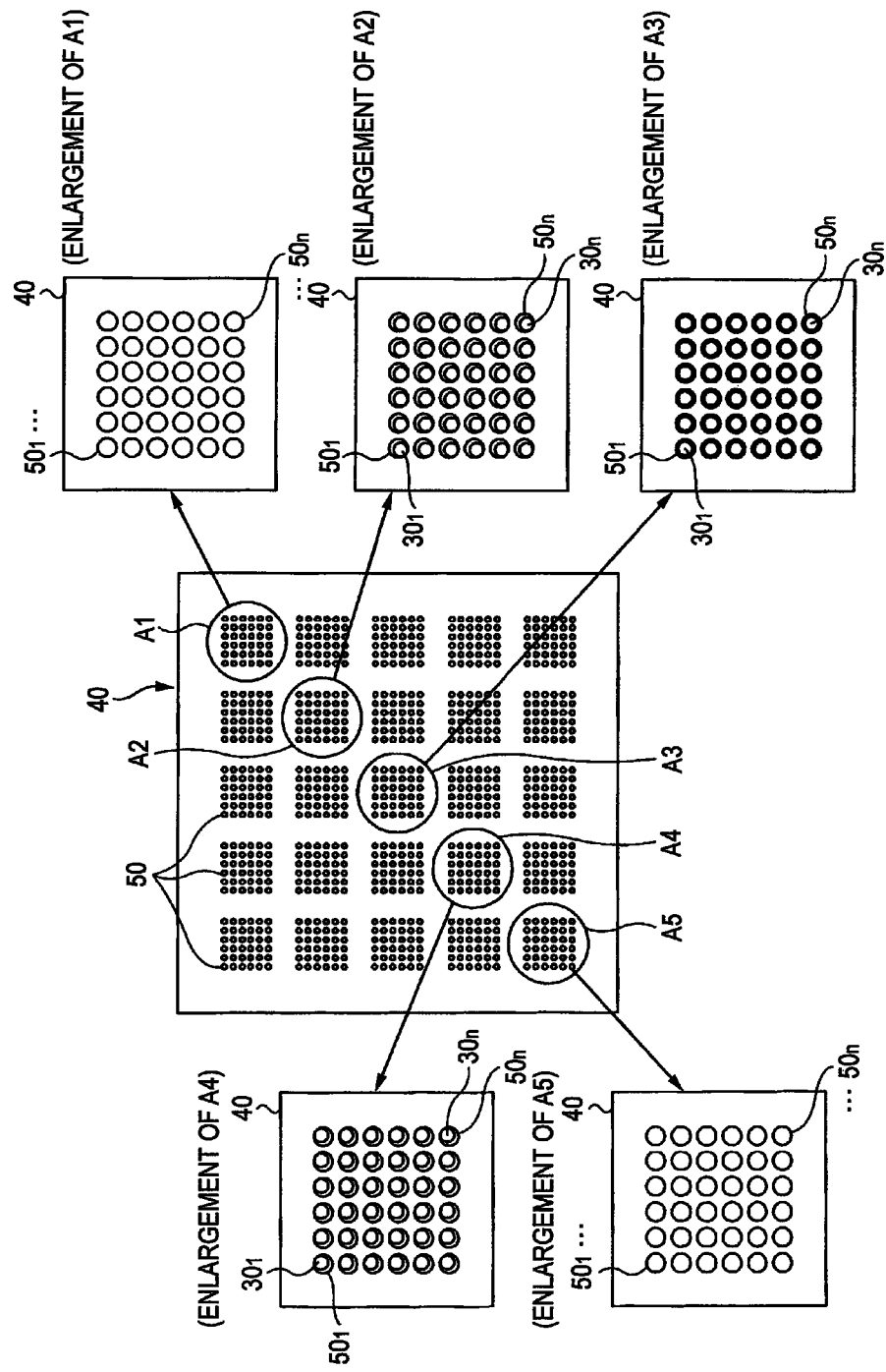

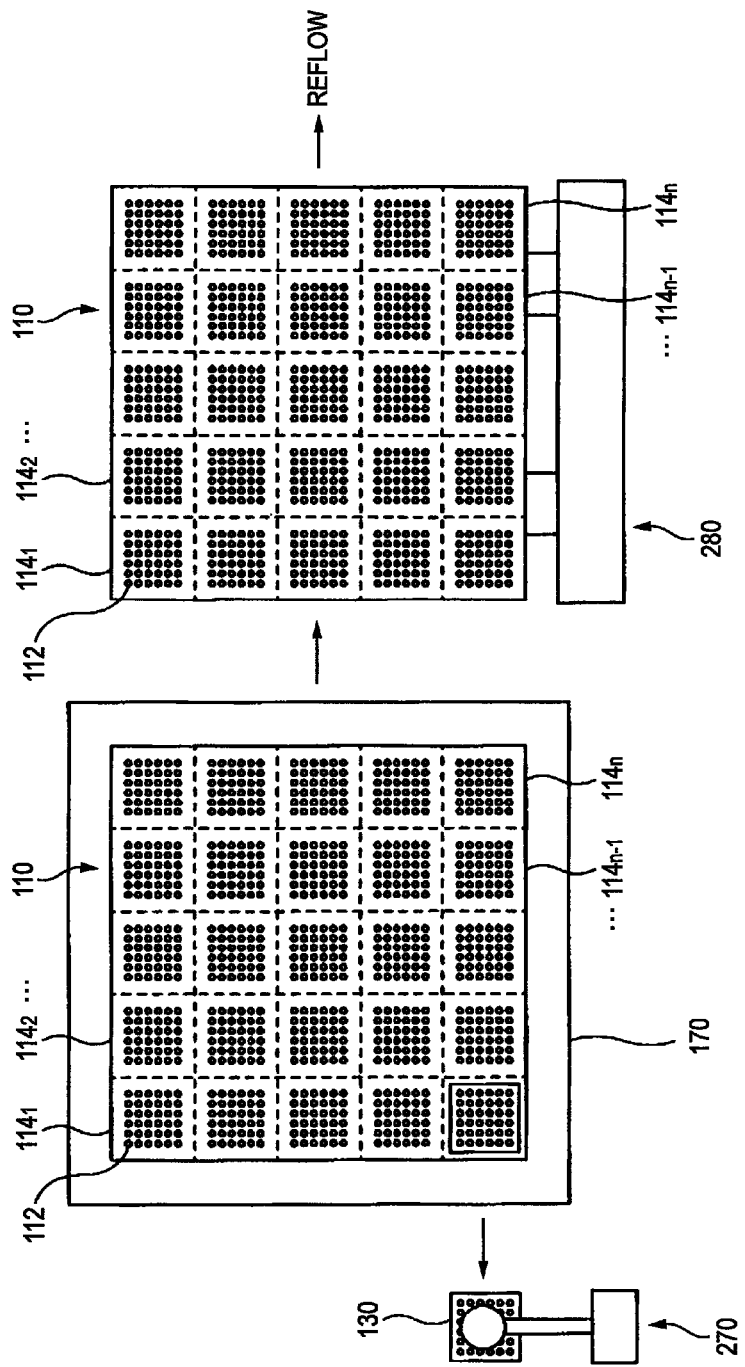

SUBSTRATE MANUFACTURING METHOD

BACKGROUND OF THE INVENTION

The present invention relates to a method and apparatus for manufacturing a substrate, and more particularly to a method and apparatus for manufacturing a substrate which reliably supplies a conductive ball to a plurality of pads of the substrate.

For example, in a wiring board of a BGA (Ball Grid Array) type or a flip-chip type, a flux is applied to pads arranged at a predetermined interval and a conductive ball is then supplied onto the flux, and a solder bump is formed on the pad through a reflow.

In a manufacturing line for the wiring board, moreover, a diameter of a conductive ball and a pitch of an interval are reduced with a reduction in a size of a semiconductor chip. For this reason, it is desirable to arrange a large number of conductive balls in all pads accurately and efficiently.

For example, a conventional conductive ball supplying method includes a transfer method of mounting, on a substrate, a mask (a conductive ball supplying member) having a plurality of holes arranged at an equal pitch to that of the pads and supplying a large number of conductive balls onto the mask, and dropping the conductive balls one by one into each of the holes of the mask (for example, see Patent Documents 1 and 2) and an adsorbing and loading method of adsorbing a conductive ball into each hole of a mask by means of an adsorbing jig to which a mask is attached and moving the adsorbing jig onto a substrate, thereby supplying the conductive ball to a pad on the substrate through a release of the adsorption (for example, see Patent Document 3).

In the method using the mask, thus, the conductive balls are supplied in a lump to a plurality of wiring boards in a state of a large substrate in which a plurality of wiring boards has not been divided into pieces in order to enhance a production efficiency.

Description will be given to a manufacturing method using the conventional transfer method. FIG. 1A is a plan view showing a multi-unit substrate. FIG. 1B is a plan view showing a mask corresponding to the multi-unit substrate. FIG. 1C is a longitudinal sectional view showing the case in which an alignment of a hole of the mask and that of a pad of the substrate are coincident with each other. FIG. 1D is a longitudinal sectional view showing the case in which the alignment of the hole of the mask and that of the pad of the substrate are not coincident with each other.

As shown in FIG. 1A, a multi-unit substrate 10 has a plurality of wiring boards 20 ($20_1$ to $20_n$) arranged in X and Y directions, and each of the wiring boards 20 has a plurality of pads 30 ($30_1$ to $30_n$) arranged to be exposed at a certain pitch (interval) in the X and Y directions. For convenience of explanation, a boundary line is shown in FIG. 1A in order to cause a region of the wiring board 20 to be clear. However, the boundary line is not actually present.

As shown in FIG. 1B, a mask (a conductive ball supplying member) 40 is formed to have a larger dimension in the X and Y directions than the dimension of the substrate 10, and a plurality of conductive ball inserting holes 50 ($50_1$ to $50_n$) at an equal pitch to the pads 30 ($30_1$ to $30_n$) is provided every region corresponding to the wiring boards 20 ($20_1$ to $20_n$). Moreover, the conductive ball inserting hole 50 ($50_1$ to $50_n$) is provided to have a slightly larger diameter than the diameter of the pad 30 ($30_1$ to $30_n$).

The mask 40 is formed by a thin metal plate having a magnetic property, for example, and is delivered to an opposed position to an upper surface of the substrate 10 and positions in the X and Y directions with respect to the substrate 10 are adjusted, and the mask 40 is thus mounted on the upper surface of the substrate 10.

As shown in FIG. 1C, the mask 40 is adjusted and fixed into a position in which the conductive ball inserting hole 50 ($50_1$ to $50_n$) is coincident with the pad 30 ($30_1$ to $30_n$). For a method of fixing the mask 40, for example, there is used a method of disposing a permanent magnet or an electromagnet on a lower surface side of the substrate 10 and adsorbing the mask 40 by a magnetic force, and fixing the mask 40 onto the upper surface of the substrate 10 in the case in which the mask 40 is formed by a magnetic material.

The position of the mask 40 with respect to the substrate 10 is adjusted in such a manner that the conductive ball inserting hole 50 ($50_1$ to $50_n$) is coincident with the pad 30 ($30_1$ to $30_n$) and a large number of conductive balls 60 are then supplied and are transferred into the conductive ball inserting holes 50 ($50_1$ to $50_n$). A flux is applied to a surface of the pad 30 ($30_1$ to $30_n$). Therefore, the conductive ball 60 taking a spherical shape inserted in the conductive ball inserting hole 50 ($50_1$ to $50_n$) is stuck to the flux having an adhesiveness. Then, a reflow is carried out to fuse the conductive ball 60, thereby forming a solder bump connected to the pad 30 ($30_1$ to $30_n$)

[Patent Document 1] JP-A-2006-005276
[Patent Document 2] JP-A-09-162533
[Patent Document 3] JP-A-2003-100789

In the substrate 10, however, an insulating layer and a conductive layer are laminated through various steps. For this reason, the position of the pad 30 ($30_1$ to $30_n$) is moved forward and backward in the X and Y directions in a process for carrying out a processing of each step. For example, as shown in FIG. 1B, there will be considered a division into regions A1 to A5 in which the conductive ball inserting hole 50 ($50_1$ to $50_n$) of the mask 40 is provided. In the region A3 on a center of the mask, the conductive ball inserting hole 50 ($50_1$ to $50_n$) is coincident with the pad 30 ($30_1$ to $30_n$). Therefore, the conductive ball 60 can be supplied to the pad 30 ($30_1$ to $30_n$). In the regions A2 and A4 positioned on an outside of the region A3, moreover, the conducive ball inserting hole 50 ($50_1$ to $50_n$) and the pad 30 ($30_1$ to $30_n$) are slightly shifted from each other and a part of the pad 30 ($30_1$ to $30_n$) is coincident with the conductive ball inserting hole 50 ($50_1$ to $50_n$). Therefore, the conductive ball 60 can be supplied to the pad 30 ($30_1$ to $30_n$)

In the regions A1 and A5 provided in the vicinity of a peripheral edge portion of the mask 40, however, the conductive ball inserting hole 50 ($50_1$ to $50_n$) and the pad 30 ($30_1$ to $30_n$) are perfectly shifted from each other. Therefore, the conductive ball 60 inserted in the conductive ball inserting hole 50 ($50_1$ to $50_n$) is loaded onto the insulating layer of the substrate 10 which is provided out of the pad 30 ($30_1$ to $30_n$) as shown in FIG. 1D. Consequently, it is impossible to form a solder bump on the pad 30 ($30_1$ to $30_n$).

In the conventional manufacturing method, thus, there is a problem in that a region in which the conductive ball 60 cannot be supplied to the pad 30 is generated in the case in which the position of the pad 30 ($30_1$ to $30_n$) is greatly shifted from the conductive ball inserting hole 50 ($50_1$ to $50_n$) of the mask 40 through the regions A1 to A5 provided on the substrate 10. A relative positional shift tendency of the conductive ball insertion hole 50 ($50_1$ to $50_n$) and the pad 30 ($30_1$ to $30_n$) in each of the regions A1 to A5 shown in FIG. 1B is not necessarily determined but the influence of the expansion and contraction of the substrate 10 is shown for easy understanding.

Moreover, the expansion and contraction of the substrate rarely appears uniformly. In many cases, therefore, the substrate is almost expanded and contracted to be laterally asymmetrical. In some cases, moreover, the substrate is expanded and contracted in a different direction every lot. As a countermeasure to be taken against the positional shift of the pad 30 through the expansion and contraction of the substrate, it is possible to propose a method of measuring a direction and amount of the expansion and contraction every lot and preparing the mask 40 in which the conductive ball inserting hole 50 is formed in a corresponding position to a result of the measurement. In the method, however, there is fabricated the mask 40 which is varied every lot. For this reason, it is hard to execute the method.

SUMMARY OF THE INVENTION

In consideration of the circumstances, therefore, it is an object of the invention to provide a method and apparatus for manufacturing a substrate which solves the problems.

In order to solve the problems, the invention has the following means.

In order to solve the problems, according to a first aspect of the invention, there is provided a method of manufacturing a substrate including the steps of:

supplying a conductive ball to a plurality of pads formed on a surface of a multi-unit substrate, and dividing the substrate into pieces having a predetermined size, wherein a conductive ball supplying member having a plurality of holes corresponding to the pads included in one of regions in the surface of the substrate is opposed to the region of the substrate, a position of the conductive ball supplying member is adjusted in such a manner that the holes are coincident with the pads included in the region, and each of the holes of the conductive ball supplying member is utilized to supply the conductive ball to the pad of the substrate.

According to a second aspect of the invention, there is provided the method of manufacturing a substrate according to the first aspect, wherein the conductive ball supplying member has an area opposed to the region of the substrate, and is held in a close state to the region of the substrate after the alignment is completed.

According to a third aspect of the invention, there is provided the method of manufacturing a substrate according to the first aspect, wherein the position of the conductive ball supplying member is adjusted in such a manner that each of the holes is coincident with each of the pads formed in the region of the substrate, the conductive ball supplying member is held on an upper surface of the substrate, and the conductive ball is inserted into each of the holes from above.

According to a forth aspect of the invention, there is provided the method of manufacturing a substrate according to the first aspect, wherein the position of the conductive ball supplying member is adjusted in such a manner that each of the holes is coincident with each of the pads formed in the region of the substrate, the conductive ball supplying member is held on a lower surface of the substrate, and the conductive ball is inserted into each of the holes from below.

According to a fifth aspect of the invention, there is provided the method of manufacturing a substrate according to the first aspect, wherein the conductive ball is supplied to the pad through each of the holes of the conductive ball supplying member by a conductive ball supplying device disposed to be opposed to the conductive ball supplying member.

According to a sixth aspect of the invention, there is provided the method of manufacturing a substrate according to the fifth aspect, wherein the conductive ball supplying device includes the conductive ball supplying member provided to be opposed to the upper or lower surface of the substrate, and supplies the conductive ball to the pad of the substrate through each of the holes of the conductive ball supplying member.

According to a seventh aspect of the invention, there is provided the method of manufacturing a substrate according to the first aspect, wherein the conductive ball supplying member is provided with a plurality of sucking holes opposed to one of the regions of the substrate, and delivers the conductive ball sucked into the sucking holes to a position opposed to the pad in the region of the substrate, and then supplies the conductive ball to the pad of the substrate.

According to an eighth aspect of the invention, there is provided the method of manufacturing a substrate according to the fifth aspect, wherein the conductive ball supplying member is held in the conductive ball supplying device.

According to a ninth aspect of the invention, there is provided the method of manufacturing a substrate according to the first aspect, wherein an area of the conductive ball supplying member is set to be larger than that of the region, and a relief portion for preventing an interference with an object to be loaded onto the pad is provided in a position adjacent to a region in which a plurality of holes corresponding to the pad is formed.

According to a tenth aspect of the invention, there is provided the method of manufacturing a substrate according to the first aspect, wherein a flux is applied to the pad, and the conductive ball is bonded to the pad through the flux.

According to an eleventh aspect of the invention, there is provided an apparatus for manufacturing a substrate which supplies a conductive ball to a plurality of pads formed on a surface of a multi-unit substrate, including:

a delivering section for delivering a conductive ball supplying member having a size corresponding to a region of the surface of the substrate to a position opposed to the region;

a position adjusting section for adjusting a position of the conductive ball supplying member with respect to the region in such a manner that each hole of the conductive ball supplying member is coincident with the pad; and a conductive ball supplying section for supplying the conductive ball to each hole of the conductive ball supplying member.

According to a twelfth aspect of the invention, there is provided the method of manufacturing a substrate according to the eleventh aspect, further including:

a holding section for holding the conductive ball supplying member having a position opposed to the region of the substrate adjusted by the position adjusting section into a close state to the region.

According to the invention, the conductive ball supplying member having a plurality of holes corresponding to the pads included in one of the regions in the surface of the substrate is opposed to the region of the substrate and the position of the conductive ball supplying member is adjusted in such a manner that the holes are coincident with the pads included in the region, and each of the holes of the conductive ball supplying member is utilized to supply the conductive ball to the pad of the substrate. Even if the positions of the pads are changed irregularly over the whole substrate through the expansion and contraction of the substrate, therefore, each of the holes of the conductive ball supplying member can easily be aligned so as to be coincident with the pad every region. It is possible to reliably supply the conductive balls to all of the pads of the multi-unit substrate.

BRIEF DESCRIPTION OF THE DRAWINGS

FIG. 1B is a plan view showing a mask corresponding to the multi-unit substrate, FIG. 2E is a plan view for explaining a removal of the individual mask and a delivery-out of the substrate.

DETAILED DESCRIPTION OF THE PREFERRED EMBODIMENTS

The best mode for carrying out the invention will be described below with reference to the drawings.

First Example

Figure 1A:
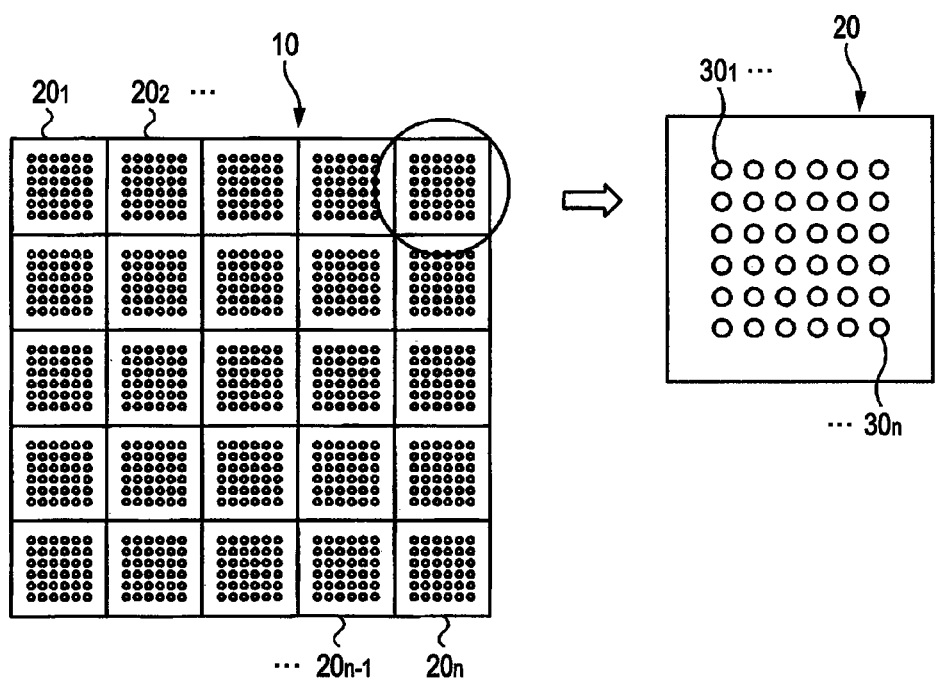
FIG. 1A is a plan view showing a multi-unit substrate.
Figure 1C:
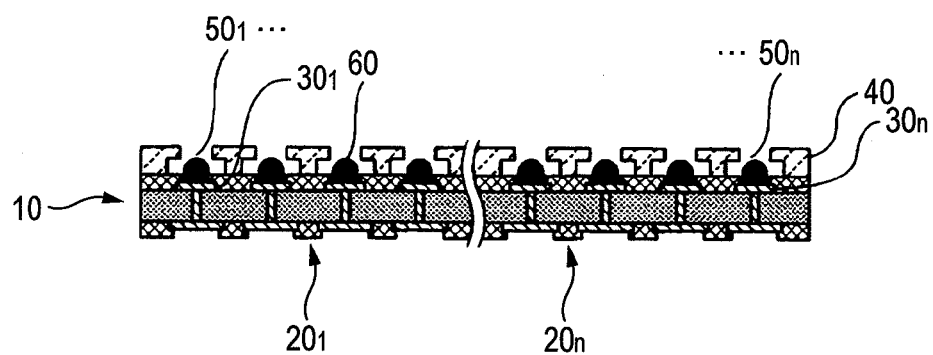
FIG. 1C is a longitudinal sectional view in the case in which an alignment of a hole of the mask and that of a pad of the substrate are coincident with each other.
Figure 1D:
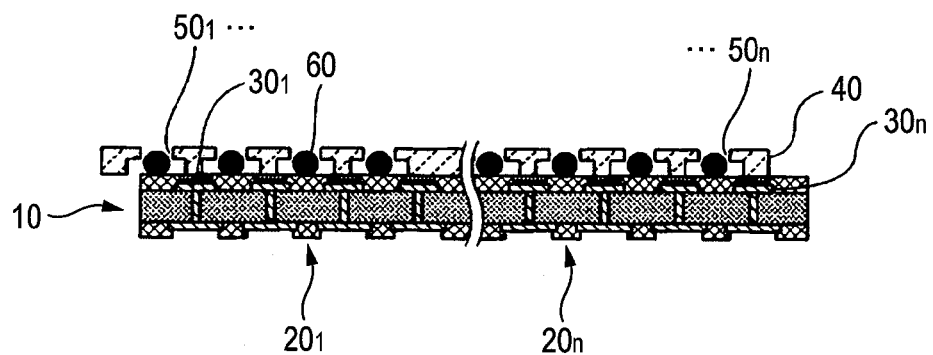
FIG. 1D is a longitudinal sectional view in the case in which the alignment of the hole of the mask and that of the pad of the substrate are not coincident with each other.
Figure 2A:
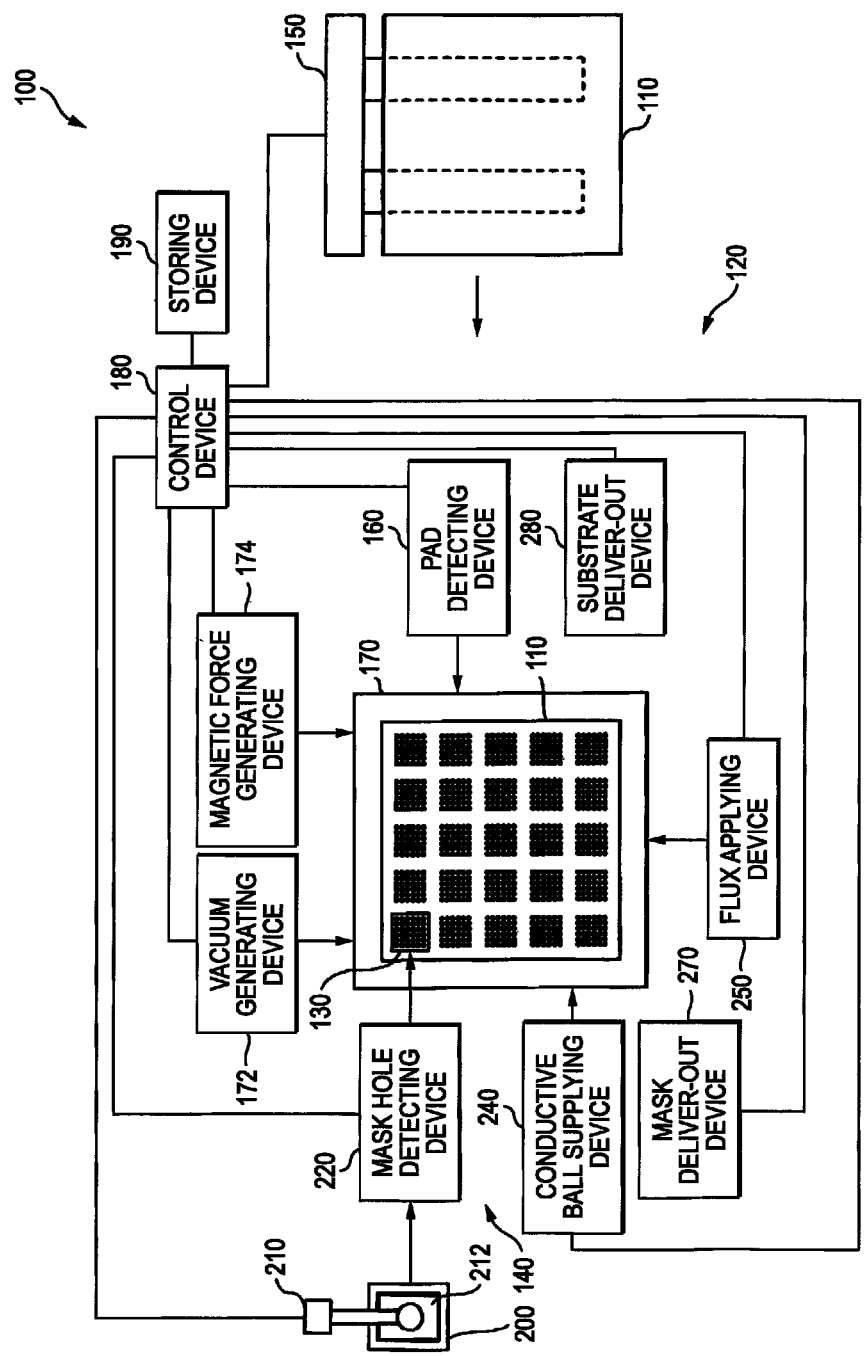
FIG. 2A is a plan view typically showing an example of a substrate manufacturing apparatus according to the invention.
Figure 2B:
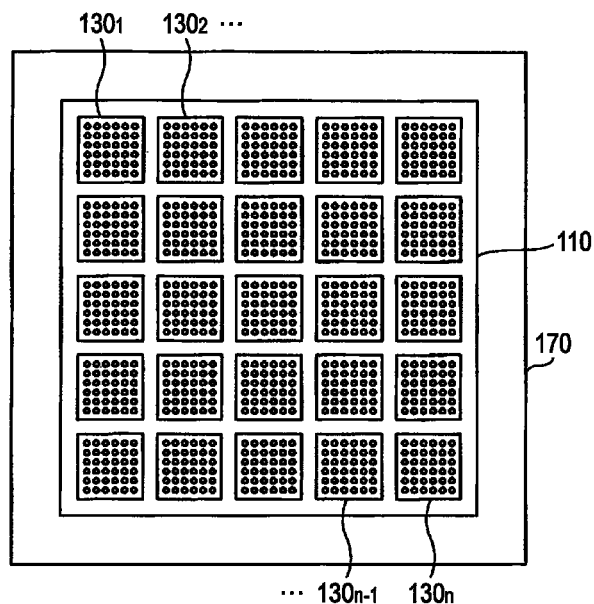
FIG. 2B is a plan view showing a state in which an individual mask is mounted on a substrate disposed on a table.
Figure 2C:
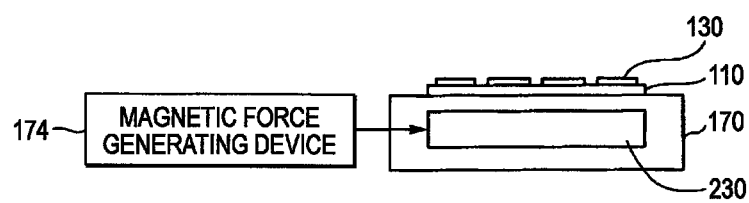
FIG. 2C is a side view showing a state in which the individual mask is mounted on the substrate disposed on the table.
Figure 2D:
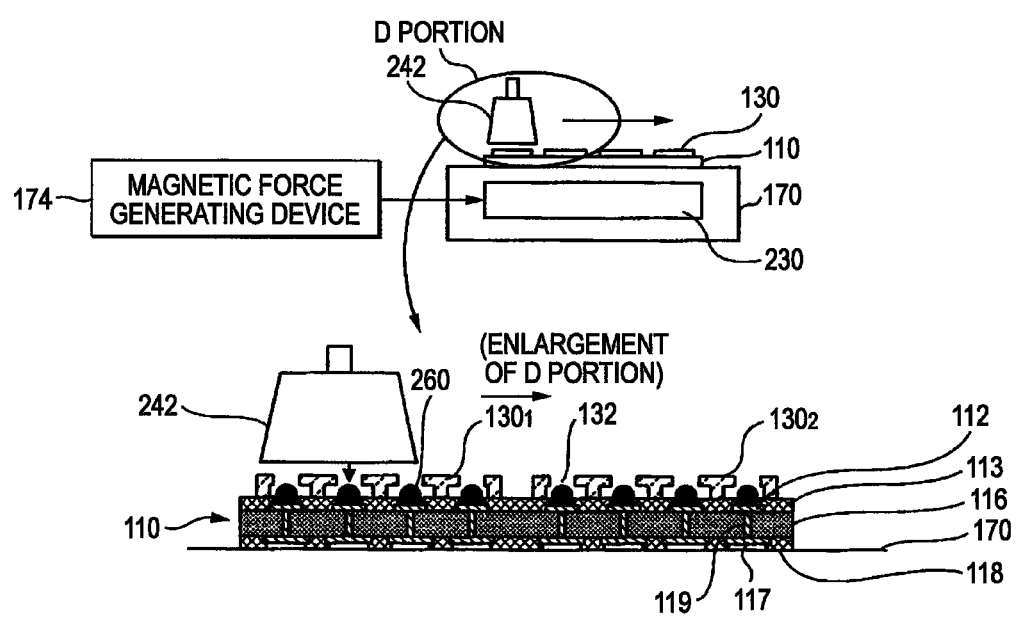
FIG. 2D is a side view showing a state in which a conductive ball is supplied to the individual mask.

FIG. 2A is a plan view typically showing an example of an apparatus for manufacturing a substrate according to the invention. FIG. 2B is a plan view showing a state in which an individual mask is mounted on the substrate disposed on a table. FIG. 2C is a side view showing a state in which the individual mask is mounted on the substrate disposed on the table. FIG. 2D is a side view showing a state in which a conductive ball is supplied to the individual mask. FIG. 2E is a plan view for explaining a removal of the individual mask and a delivery-out of the substrate.

As shown in FIG. 2A, a substrate manufacturing apparatus 100 comprises a substrate delivery path 120 for delivering a multi-unit substrate 110, a mask delivery path 140 through which an individual mask (a conductive ball supplying member) 130 is delivered, a table 170 on which the substrate 110 is to be mounted, a control device 180 for controlling each apparatus, a conductive ball supplying device 240, a flux applying device 250, a mask deliver-out device 270, and a substrate deliver-out device 280. The substrate 110 is set in a state in which a plurality of wiring boards has not been divided into pieces, and the individual mask 130 is formed to have a size corresponding to a smaller region than the substrate 110. In the example, the individual mask 130 is formed by a magnetic material and is formed to have a dimension corresponding to a size of the wiring board.

The substrate delivery path 120 has a substrate deliver-in device 150 for delivering the substrate 110 in, a pad detecting device 160 for detecting a position of a pad 112 formed on a surface of the substrate 110, and the flux applying device 250 for applying a flux to the pad. The pad detecting device 160 detects a large number of pad positions (XY coordinate positions) formed on the substrate 110 mounted on the table 170 by using an imaging device such as a CCD camera and outputs the substrate detection data (pad position information) to the control device 180. The control device 180 stores the substrate detection data in a storing device 190. The flux applying device 250 has a head of an ink jet type and applies the flux to each pad exposed onto the substrate 110 based on the substrate detection data.

The pad 112 of the substrate 110 is arranged at a predetermined interval for each of regions $114_1$ to $114_n$ serving as the wiring boards (see FIG. 2E). While description will be given by taking, as an example, the case in which the regions $114_1$ to $114_n$ are set corresponding to the respective wiring boards in the example, this is not restricted but one region may correspond to at least two wiring boards, for example.

Moreover, the table 170 has a vacuum generating device (substrate holding means) 172 for vacuum adsorbing the substrate 110 into an inner part and a magnetic force generating device (mask holding means) 174 for magnetically adsorbing the individual mask 130. When the substrate 110 is delivered onto the table 170 through the substrate deliver-in device 150 and is mounted, a vacuum generated by the vacuum generating device 172 is introduced into an adsorbing passage in the table 170. Consequently, the substrate 110 mounted on the table 170 is adsorbed (fixed) into the table 170.

The mask delivery path 140 has a mask housing portion 200 in which the individual mask 130 is accommodated, a mask deliver-in device 210 for adsorbing the individual masks 130 one by one from the mask housing portion 200 and delivering them onto the substrate 110, and a mask hole detecting device 220 for detecting a position of a conductive ball inserting hole 132 of the individual mask 130.

The mask deliver-in device 210 adsorbs the individual mask 130 accommodated in the mask housing portion 200 by a sucking force using a vacuum or a magnetism from above, and lifts the individual mask 130 upward and delivers the individual mask 130 to the table 170. The mask hole detecting device 220 detects positions (XY coordinate positions) of a large number of conductive ball inserting holes 132 formed on the individual mask 130 in a delivering process using an imaging device such as a CCD camera and outputs the mask hole detection data (mask hole position information) to the control device 180. The control device 180 stores the mask hole detection data in the storing device 190.

The conductive ball supplying device 240 inserts a conductive ball into the conductive ball inserting hole of each of the individual masks 130 ($130_1$ to $130_n$) mounted on the substrate 110 based on the mask hole detection data.

As shown in FIG. 2B, the mask deliver-in device 210 delivers the individual mask 130 to each region on an upper surface of the substrate 110 mounted on the table 170 and adjusts a position every region of the substrate 110. In that case, the control device 180 collates the substrate detection data stored in the storing device 190 with the mask hole detection data and adjusts and controls the position of the individual mask 130 ($130_1$ to $130_n$) in such a manner that the position of the pad 112 is coincident with that of the conductive ball inserting hole 132 in each region.

As shown in FIG. 2C, the table 170 is provided with an electromagnet 230 for generating an electromagnetic force through a conduction from the magnetic force generating device 174. The individual mask 130 having a position adjusted with respect to the region of the substrate 110 is sucked onto the substrate 110 by a magnetic force applied from the electromagnet 230. The individual mask 130 is formed by a soft magnetic material such as Ni or Fe so as to be adsorbed by the magnetic force.

When the position of the individual mask 130 is adjusted and the individual mask 130 is mounted on a whole region of the substrate 110, a head 242 of the conductive ball supplying device 240 is moved above the individual mask 130 ($130_1$ to $130_n$), and at the same time, inserts a conductive ball 260 into the conductive ball inserting hole 132 of the individual mask 130 as shown in FIG. 2D. The conductive ball 260 is a spherical member formed by a conductive material (for example, Pb, Sn, Cu, Au, Ag, W, Ni, Mo or Al) or a spherical member using a resin as a core and having a surface covered with the conductive material, and is formed to have a smaller diameter than a diameter of the conductive ball inserting hole of the individual mask 130.

Moreover, the substrate 110 is provided with the pad 112 formed by a Cu layer on an upper surface of an insulating layer 116 constituted by an insulating resin such as an epoxy resin or a polyimide resin and a solder resist 113 for covering a portion between the pads 112. Furthermore, the substrate 110 is provided with a pad 117 formed by a Cu layer on a lower surface of the insulating layer 116 and a solder resist 118 for covering a portion between the pads 117, and the pads 112 and 117 are electrically connected to each other by a through electrode 119 formed by a Cu layer.

The pads 112 and 117 are not restricted to only the Cu layer but it is also possible to employ another plating structure, for example, a structure in which an Au layer and an Ni layer are laminated in such a manner that the Au layer is exposed to the surface of the substrate, a structure in which an Au layer, an Ni layer, a Pd layer and a Cu layer are laminated in this order in such a manner that the Au layer is exposed to the surface of the substrate or a structure in which an Au layer, a Pd layer and an Ni layer are laminated in this order.

When the conductive ball 260 is inserted into the whole conductive ball inserting hole 132 of the individual mask 130 ($130_1$ to $130_n$) mounted on the substrate 110, all of the individual masks 130 are removed through the mask deliver-out device 270. As shown in FIG. 2E, then, the substrate 110 is delivered out of the table 170 through the mask deliver-out device 280 to carry out a reflow treatment over the substrate 110. By the reflow treatment, the conductive ball 260 is a hemispherical solder bump soldered to the pad 112 of the substrate 110. In FIG. 2E, for convenience of the description, a boundary line indicative of a boundary between the regions $114_1$ to $114_n$ is shown in a broken line and is not actually present.

A method of manufacturing a substrate by using the substrate manufacturing apparatus 100 will be described with reference to FIGS. 3A to 3L. FIGS. 3A to 3L are views for explaining the method of manufacturing a substrate (No. 1 to No. 12). In FIGS. 3A to 3L, the substrate 110 is partially shown and a whole structure of the substrate manufacturing apparatus 100 is shown in FIGS. 2A to 2E.

Figure 3A:
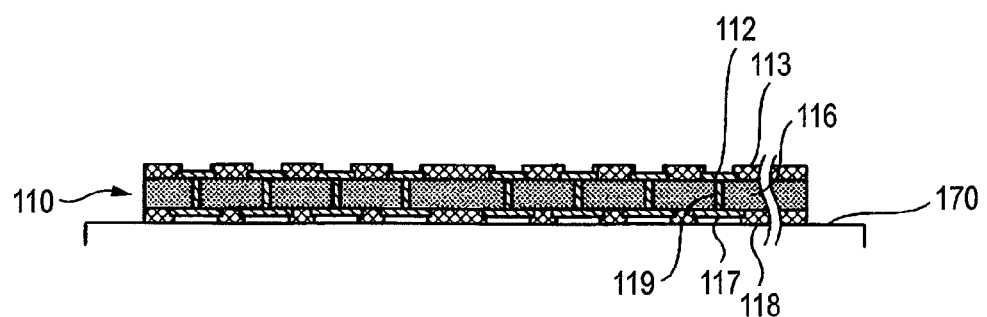
FIG. 3A is a view for explaining a method (No. 1) of manufacturing a substrate according to a first example.

In FIG. 3A, the multi-unit substrate 110 is fabricated and delivered onto the table 170 through the substrate deliver-in device 150. When the substrate 110 is mounted on the table 170, a vacuum is introduced into a sucking passage in the table 170 through the vacuum generating device 172 so that the substrate 110 is held on the table 170. The substrate 110 has a plurality of pads 112 formed at a predetermined interval on the upper surface of the insulating layer 116 as described above.

Figure 3B:
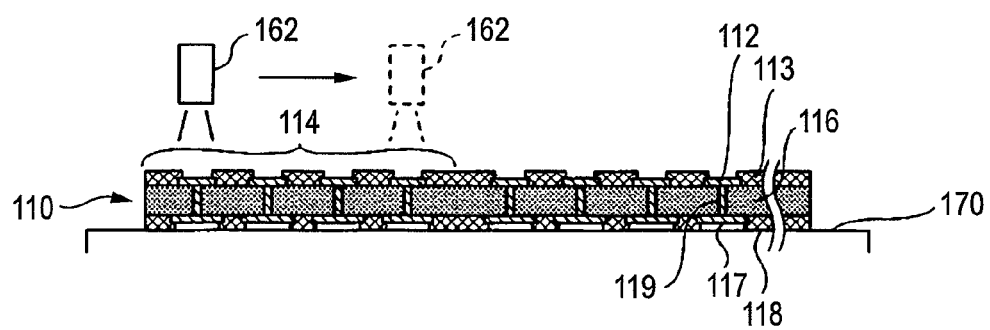
FIG. 3B is a view for explaining a method (No. 2) of manufacturing a substrate according to the first example.

In FIG. 3B, a position (an XY coordinate position) of the pad 112 arranged on an upper surface side of one of the regions 114 in the substrate 110 mounted on the table 170 is detected through a CCD camera 162 of the pad detecting device 160. Pad position information detected by the CCD camera 162 is stored in the storing device 190.

Figure 3C:
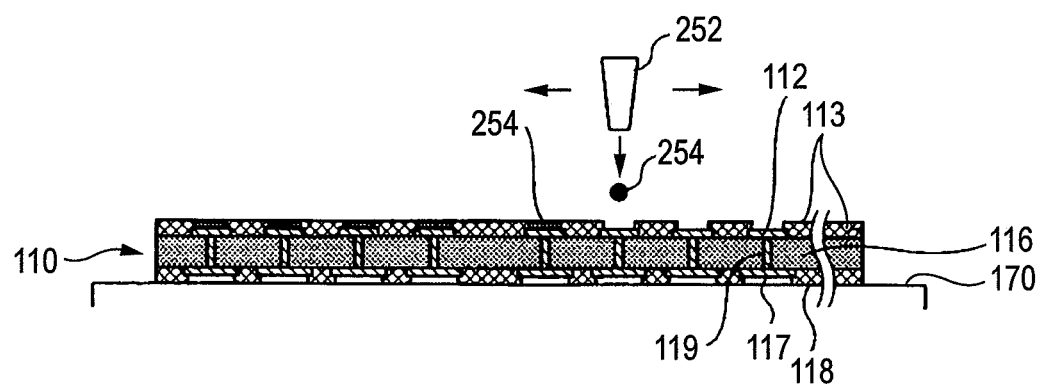
FIG. 3C is a view for explaining a method (No. 3) of manufacturing a substrate according to the first example.

In FIG. 3C, an ink jet nozzle 252 of the flux applying device 250 is moved to a portion provided above the pad 112 of each of the regions 114 ($114_1$ to $114_n$) to apply a liquid flux 254 to the surface of the pad 112. The flux 254 has a viscosity. When the conductive ball 260 is dropped, therefore, the conductive ball 260 is bonded to the pad 112 through the flux 254.

Figure 3D:
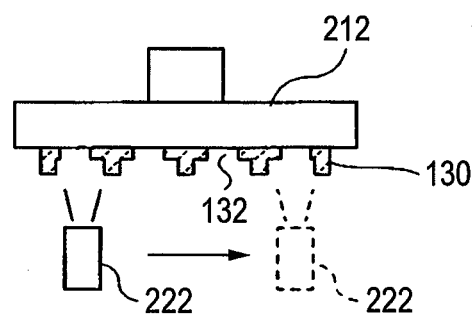
FIG. 3D is a view for explaining a method (No. 4) of manufacturing a substrate according to the first example.

In FIG. 3D, a position (XY coordinate position) of the conductive ball inserting hole 132 is detected through a CCD camera 222 of the mask hole detecting device 220 from a lower surface side of the individual mask 130 which is vacuum adsorbed through an adsorbing head 212 of the mask deliver-in device 210. Mask hole position information detected by the CCD camera 222 is stored in the storing device 190.

Figure 3E:
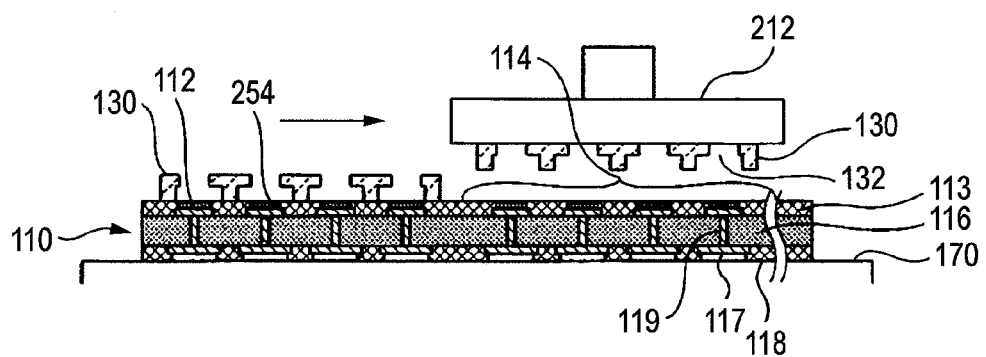
FIG. 3E is a view for explaining a method (No. 5) of manufacturing a substrate according to the first example.

In FIG. 3E, the adsorbing head 212 of the mask deliver-in device 210 delivers the individual mask 130 to the region 114 and then reads the pad position information and the mask hole position information corresponding to the region 114 which are stored in the storing device 190, and adjusts a moving position of the adsorbing head 212 based on the pad position information and the mask hole position information in such a manner that the position of the conductive ball inserting hole 132 is coincident with that of the pad 112 of the substrate 110. For the position adjustment and control, the pad position information and the mask hole position information which are stored in the storing device 190 are collated with each other to drop the individual mask 130. Therefore, the position of the conductive ball inserting hole 132 in the region 114 can be caused to be coincident with that of the pad 112.

In the region 114 which is opposed to the individual mask 130, an expansion and contraction is carried out through a heat treatment performed in the process for manufacturing the substrate 110. However, an amount of the expansion and contraction in the region 114 is 1/X (X is a several number) of that of the whole substrate 110. Therefore, all of the conductive ball inserting holes 132 of the individual masks 130 can easily be aligned with all of the pads 112 in the region 114.

According to the example, therefore, the position of the conductive ball inserting hole 132 in the region 114 can be caused to be coincident with that of the pad 112 on a unit of the individual mask 130. Consequently, the position of each of the conductive ball inserting holes 132 is coincident with that of each of the pads 112 in the whole substrate 110. Thus, it is possible to accurately supply the conductive balls 260 to all of the pads 112 in the substrate 110.

Figure 3F:
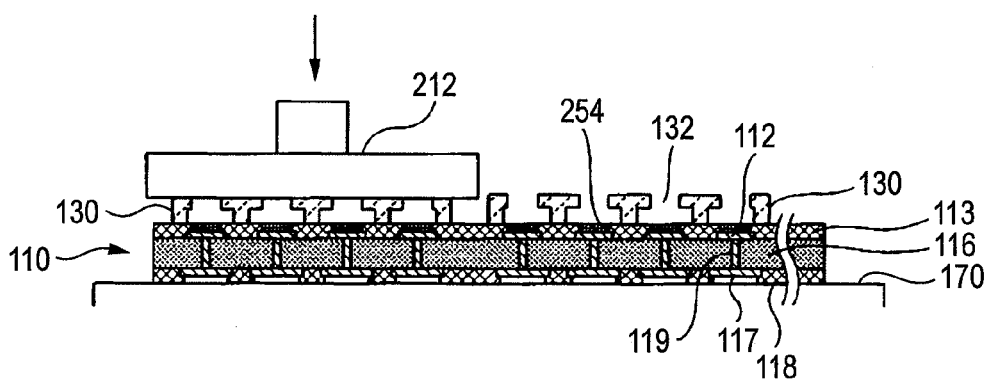
FIG. 3F is a view for explaining a method (No. 6) of manufacturing a substrate according to the first example.

In FIG. 3F, when the position of the conductive ball inserting hole 132 of the individual mask 130 is coincident with that of the pad 112 of the substrate 110, the adsorbing head 212 is dropped to mount the individual mask 130 on the region 114 in the substrate 110. The individual mask 130 is delivered to all of the regions 114 ($114_1$ to $114_n$) of the substrate 110.

Figure 3G:
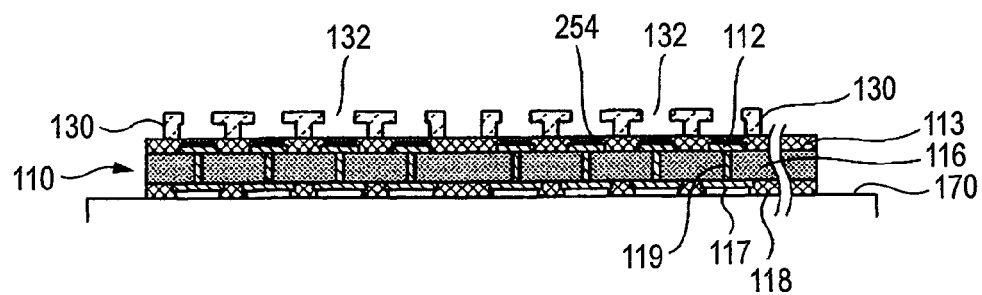
FIG. 3G is a view for explaining a method (No. 7) of manufacturing a substrate according to the first example.

In FIG. 3G, when the individual mask 130 ($130_1$ to $130_n$) having the position adjusted is mounted on the whole region 114 ($114_1$ to $114_n$) of the substrate 110 (see FIG. 2B), the electromagnet 230 is excited by the magnetic force generating device 174 and all of the individual masks 130 ($130_1$ to $130_n$) are held by the magnetic force of the electromagnet 230. Thus, the mask delivery-in of the mask deliver-in device 210 is ended. The excitation of the electromagnet 230 may be carried out by the magnetic force generating device 174 before the individual mask 130 is mounted.

Figure 3H:
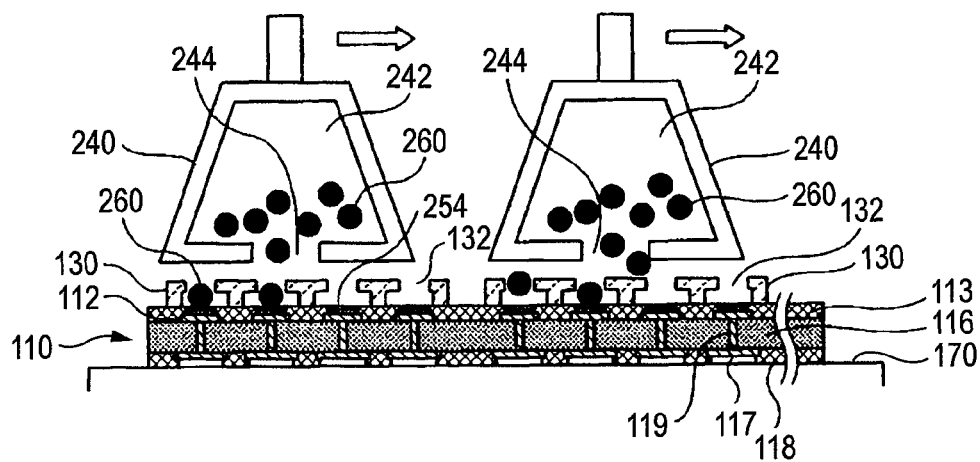
FIG. 3H is a view for explaining a method (No. 8) of manufacturing a substrate according to the first example.

In FIG. 3H, the conductive ball supplying device 240 is moved to a portion provided above the individual mask 130 on the substrate 110 and the conductive ball 260 is inserted into the conductive ball inserting hole 132 of the individual mask 130. The conductive ball supplying device 240 has the housing chamber 242 for accommodating a large number of conductive balls 260 and a bottom plate of the housing chamber 242 is provided with an opening 244 for dropping the conductive ball 260. The conductive ball supplying device 240 supplies the conductive ball 260 to the upper surface of the individual mask 130 through the opening 244 while it is moved horizontally with the opening 244 opposed close to the upper surface of the individual mask 130.

The position of the conductive ball inserting hole 132 is adjusted to be coincident with that of the pad 112 of the substrate 110 in FIG. 3E. Therefore, the conductive ball 260 dropped onto the upper surface of the individual mask 130 passes through the conductive ball inserting hole 132 of the individual mask 130 and is bonded (temporarily) to the flux 254 applied to the pad 112.

Figure 3I:
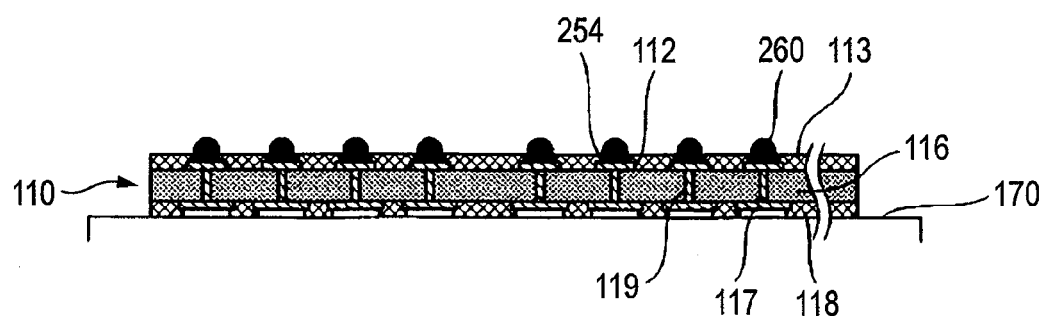
FIG. 3I is a view for explaining a method (No. 9) of manufacturing a substrate according to the first example.

In FIG. 3I, a conduction to the electromagnet 230 through the magnetic force generating device 174 is stopped so that the held for the individual mask 130 ($130_1$ to $130_n$) is released. Moreover, the individual masks 130 are lifted one by one through the mask deliver-out device 270 and are removed from the substrate 110.

Figure 3J:
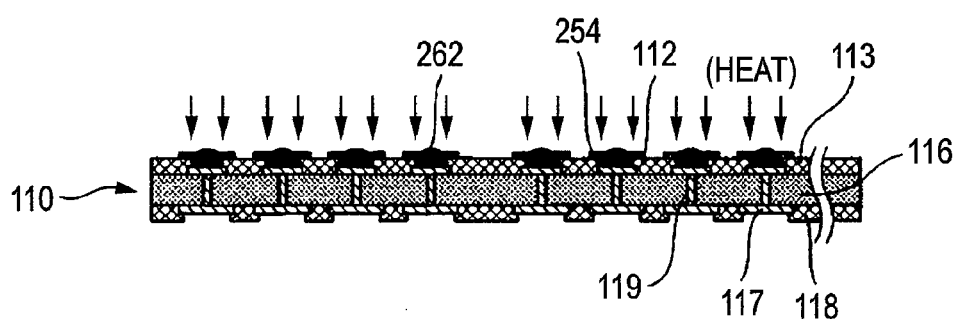
FIG. 3J is a view for explaining a method (No. 10) of manufacturing a substrate according to the first example.

In FIG. 3J, the substrate 110 is lifted from the table 170 and is thus delivered out through the substrate deliver-out device 280. Furthermore, the substrate 110 is delivered to a reflow processing step. The substrate 110 is heated by the reflow treatment so that the conductive ball 260 is molten to be a hemispherical solder bump 262. For this reason, the solder bump 262 is soldered to each pad 112 of the substrate 110 subjected to the reflow.

Figure 3K:
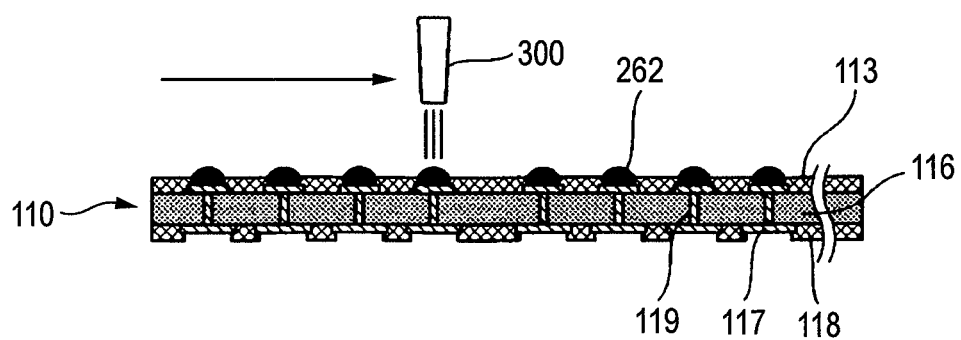
FIG. 3K is a view for explaining a method (No. 11) of manufacturing a substrate according to the first example.

In FIG. 3K, a cleaning fluid is injected from a cleaning nozzle 300 onto the surface of the substrate 110 and the flux 254 on the surface of the substrate is removed.

Figure 3L:
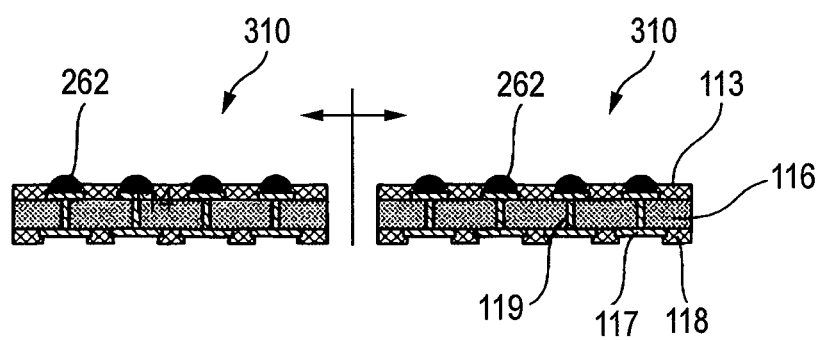
FIG. 3L is a view for explaining a method (No. 12) of manufacturing a substrate according to the first example.

In FIG. 3L, cutting is carried out through dicing along a boundary line between the regions 114 of the substrate 110 (see FIG. 2E) or a V cut formed by a dicing saw to divide a wiring board 310 into pieces from the substrate 110. In the example, each wiring board 310 corresponds to the region 114 so that one wiring board 310 is obtained from each of the regions 114.

In the case in which an electronic component such as a semiconductor chip is mounted on the wiring board 310, an electrode of the electronic component may be connected to the solder bump 262 to divide the wiring board 310 into pieces or a plurality of electronic components can also be mounted on the substrate 110 to then make a division into respective wiring boards 310.

Thus, the position of the individual mask 130 ($130_1$ to $130_n$) is adjusted to be opposed to the whole region 114 ($114_1$ to $114_n$) of the multi-unit substrate 110 and the individual mask 130 is thus held. Consequently, a productivity can be enhanced, and furthermore, the solder bump 262 can be accurately formed on each pad 112 of the substrate 110. Thus, it is not necessary to fabricate the mask every lot of the substrate 110 differently from the conventional art.

Although the description has been given by taking, as an example, the case in which one wiring board 310 is obtained from each region 114 in the first example, moreover, this is not restricted but the range of the region 114 may be enlarged so as to obtain at least two wiring boards 310 from each region 114, for example. In this case, a dimension of each side of the individual mask 130 is increased in such a manner that an area of the individual mask 130 can be increased in X and Y directions to cover the pads 112 of the wiring boards 310 with one individual mask.

While the description has been given to the case in which the conductive ball 260 is supplied to the pad 112 exposed to the upper surface of the substrate 110 in the first example, moreover, the conductive ball 260 can be supplied by the method also in the case in which the upper and lower surfaces of the substrate 110 are inverted and the pad 112 is exposed to the lower surface of the substrate 110.

Second Example

Figure 4:
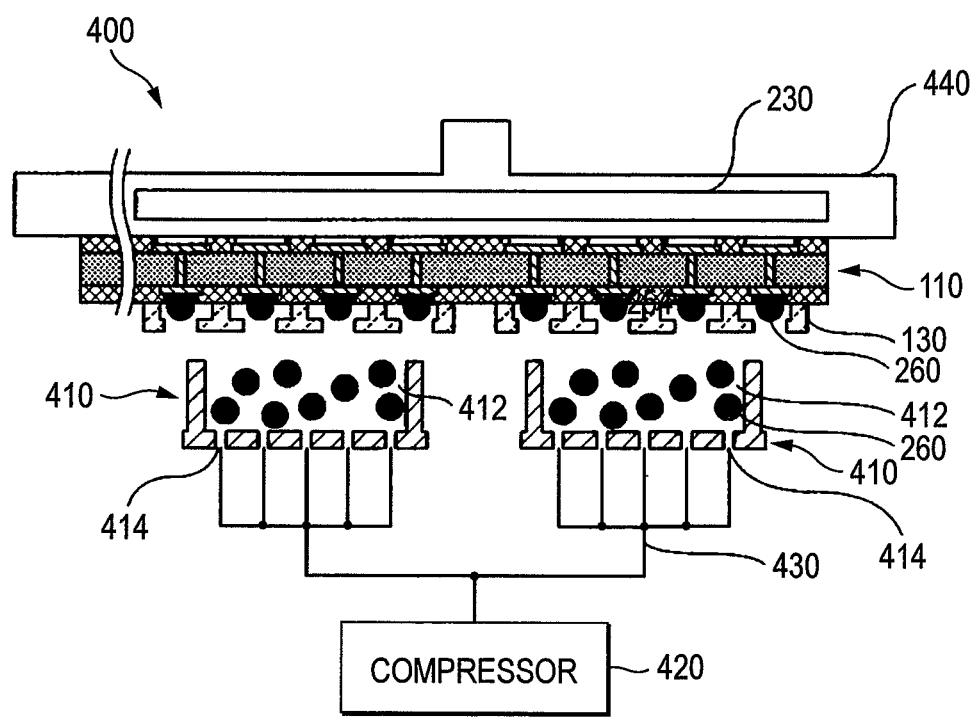
FIG. 4 is a side view showing a substrate manufacturing apparatus according to a second example.

FIG. 4 is a side view showing a substrate manufacturing apparatus according to a second example. In FIG. 4, the same portions as those in the first example have the same reference numerals and description thereof will be omitted. As shown in FIG. 4, a substrate manufacturing apparatus 400 according to the second example is constituted to supply a conductive ball 260 to a pad 112 on a lower surface side of a substrate 110 and has a vacuum chuck 440 for delivering a conductive ball supplying device 410 ($410_1$ to $410_n$) and the substrate 110.

The substrate 110 is adsorbed through the vacuum chuck 440 having an electromagnet 230 and is delivered to a portion provided above the conductive ball supplying device 410 ($410_1$ to $410_n$) together with the vacuum chuck 440. The conductive ball supplying device 410 ($410_1$ to $410_n$) is individually disposed on the lower surface side of the substrate 110 so as to be opposed to an individual mask 130 ($130_1$ to $130_n$)

In the conductive ball supplying device 410 ($410_1$ to $410_n$), moreover, a large number of conductive balls 260 are accommodated in a conductive ball housing box 412 having an upper part opened, and a plurality of air injecting holes 414 is provided in a bottom part of the conductive ball housing box 412. Compressed air is supplied from a compressor 420 to each of the air injecting holes 414 through an air pipe 430. The compressed air is injected upward from the air injecting hole 414 so that the conductive ball supplying device 410 ($410_1$ to $410_n$) can blow off the conductive ball 260 accommodated in the conductive ball housing box 412 toward the individual mask 130. Consequently, the conductive ball 260 passes through a conductive ball inserting hole 132 and is thus bonded (temporarily) to a flux 254 applied to the pad 112.

Although the conductive ball 260 is blown toward the individual mask 130 through the compressed air supplied from the compressor 420 in the example, this is not restricted but the conductive ball housing box 412 can also be vibrated to supply the conductive ball 260 to the individual mask 130 at an acceleration generated by the vibration, for instance.

A manufacturing method according to the second example will be described with reference to FIGS. 5A to 5E. FIGS. 5A to 5E are views for explaining the manufacturing method (No. 1 to No. 5) according to the second example. Since a step of attaching the individual mask 130 to each region 114 of the substrate 110 is the same as the method shown in FIGS. 3A to 3G, description thereof will be omitted.

Figure 5A:
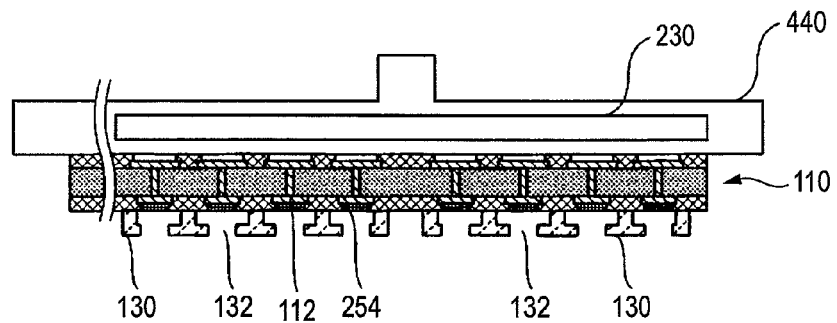
FIG. 5A is a view for explaining a method (No. 1) of manufacturing a substrate according to the second example.

In FIG. 5A, the vacuum chuck 440 to be moved by a delivering device adsorbs the substrate 110 through a vacuum and is moved with the individual mask 130 held in each attaching position of the substrate 110 by a magnetic force of the electromagnet 230. The substrate 110 is delivered with upper and lower surfaces inverted in such a manner that the individual mask 130 is turned onto the lower surface side.

Figure 5B:
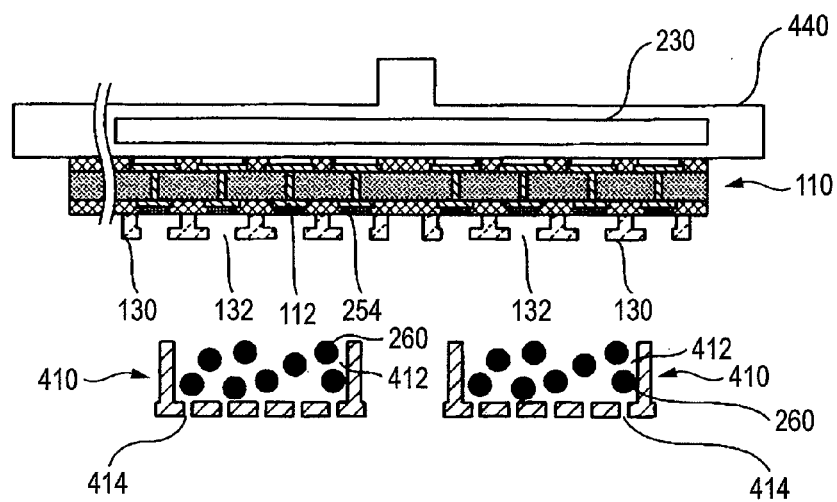
FIG. 5B is a view for explaining a method (No. 2) of manufacturing a substrate according to the second example.

In FIG. 5B, the vacuum chuck 440 is stopped in a position in which the individual mask 130 ($130_1$ to $130_n$) on the lower surface side of the substrate 110 is opposed to the conductive ball supplying device 410 ($410_1$ to $410_n$)

Figure 5C:
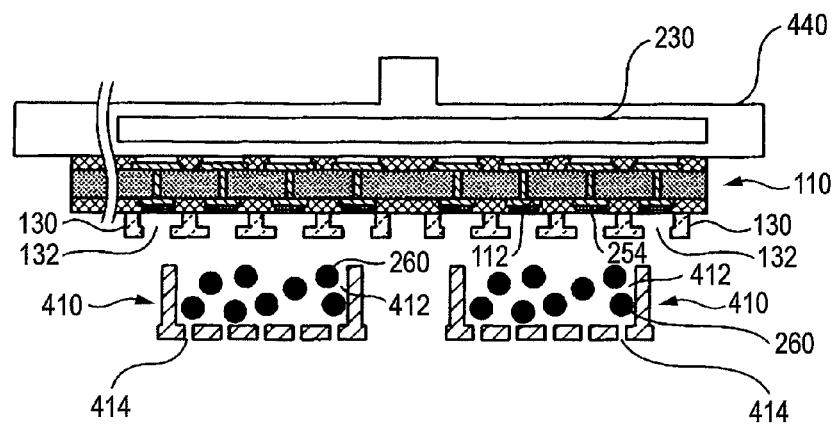
FIG. 5C is a view for explaining a method (No. 3) of manufacturing a substrate according to the second example.

In FIG. 5C, the vacuum chuck 440 drops the substrate 110 to a height position which is close to the conductive ball supplying device 410 ($410_1$ to $410_n$) through an operation for dropping the delivering device.

Figure 5D:
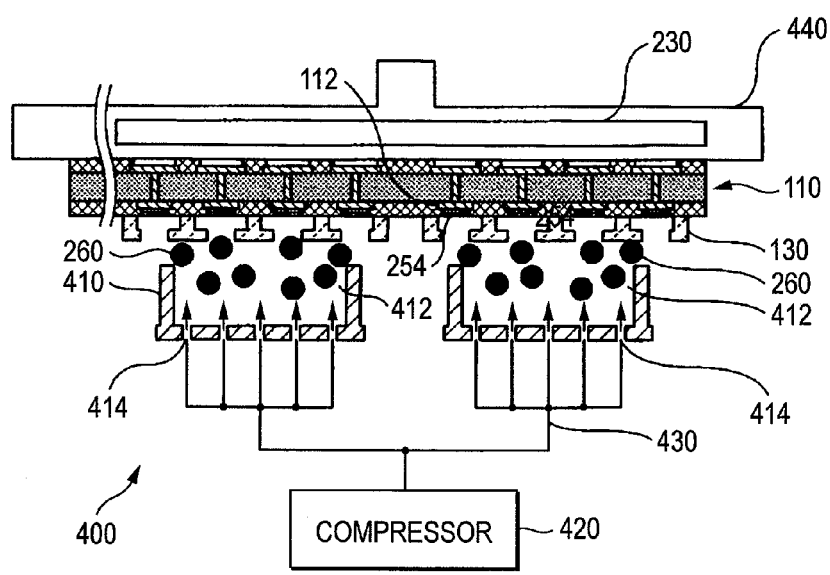
FIG. 5D is a view for explaining a method (No. 4) of manufacturing a substrate according to the second example.

In FIG. 5D, the compressor 420 is started to generate the compressed air. The compressed air generated in the compressor 420 is supplied to the air injecting holes 414 through the air pipe 430. Consequently, the conductive ball 260 accommodated in each of the conductive ball housing box 412 of the conductive ball supplying device 410 ($410_1$ to $410_n$) is floated through a flow of the compressed air injected from the air injecting hole 414 and is blown toward the individual mask 130.

In the individual mask 130, the position of the conductive ball inserting hole 132 is adjusted to be coincident with that of the pad 112 of the substrate 110 in the same manner as in the first example. Therefore, the conductive ball 260 blown from the conductive ball supplying device 410 ($410_1$ to $410_n$) passes through the conductive ball inserting hole 132 and is bonded (temporarily) to the flux 254 applied to the pad 112.

Figure 5E:
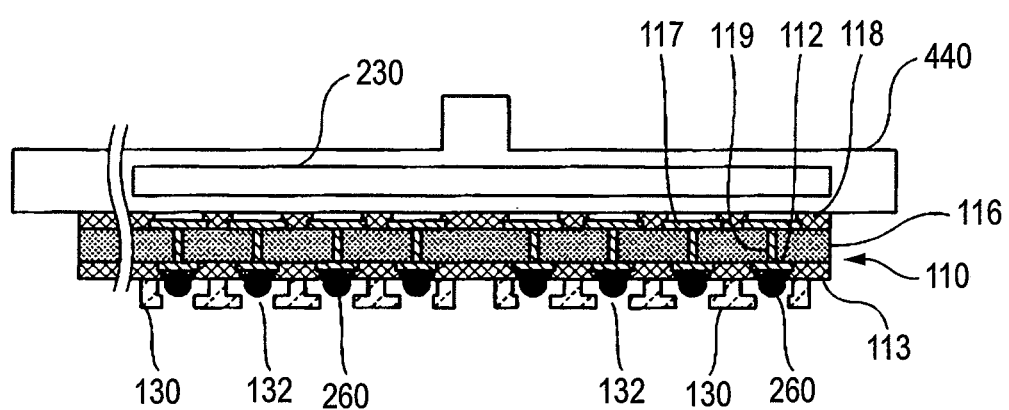
FIG. 5E is a view for explaining a method (No. 5) of manufacturing a substrate according to the second example.

In FIG. 5E, the vacuum chuck 440 stops a conduction to the electromagnet 230 to remove the individual mask 130 from the substrate 110, and the substrate 110 is then separated from the conductive ball supplying device 410 ($410_1$ to $410_n$) by a delivering operation of the delivering device. In the same manner as in FIGS. 3J to 3L according to the first example, thereafter, the conductive ball 260 is subjected to the reflow to connect a solder bump 262 to the pad 112, and furthermore, the flux 254 is cleaned to make a division into respective wiring boards 310.

In the second example, thus, the position of the individual mask 130 ($130_1$ to $130_n$) is adjusted and held in such a manner that the individual mask 130 ($130_1$ to $130_n$) is opposed to the whole region 114 ($114_1$ to $114_n$) of the multi-unit substrate 110. Consequently, a productivity can be enhanced, and furthermore, the solder bump 262 can be accurately formed on each pad 112 of the substrate 110. Thus, it is not necessary to fabricate a mask every lot of the substrate 110 differently from the conventional art.

Third Example

Figure 6:
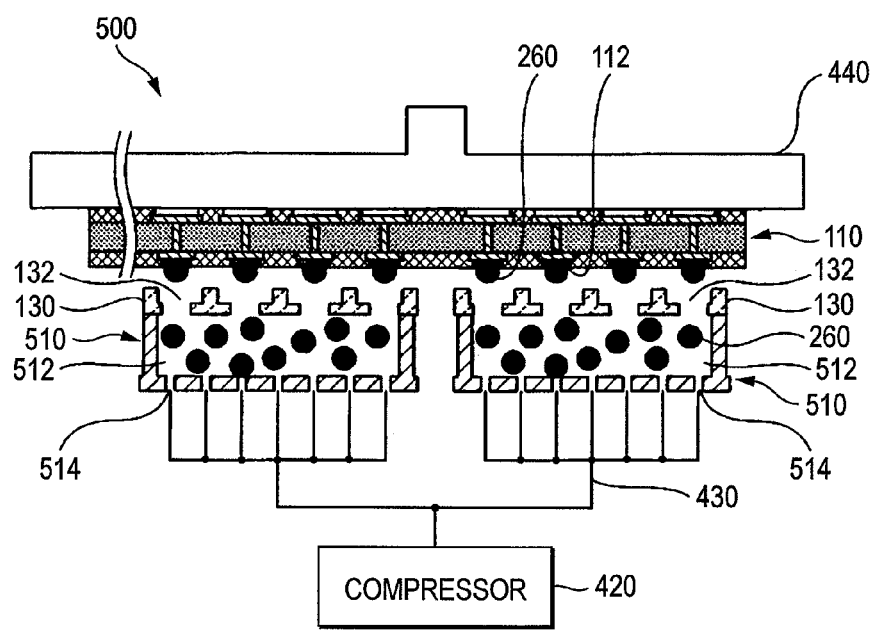
FIG. 6 is a side view showing a substrate manufacturing apparatus according to a third example.

FIG. 6 is a side view showing a substrate manufacturing apparatus according to a third example. In FIG. 6, the same portions as those in the first and second examples have the same reference numerals and description thereof will be omitted. As shown in FIG. 6, a substrate manufacturing apparatus 500 according to the third example is constituted to supply a conductive ball 260 to a pad 112 on a lower surface side of a substrate 110 and has a vacuum chuck 440 for delivering a conductive ball supplying device 510 ($510_1$ to $510_n$) and the structure 110. An individual mask 130 ($130_1$ to $130_n$) is attached to an upper opening of the conductive ball supplying device 510 ($510_1$ to $510_n$).

The substrate 110 is adsorbed through the vacuum chuck 440 and is delivered to a portion provided above the conductive ball supplying device 510 ($510_1$ to $510_n$) together with the vacuum chuck 440.

In the conductive ball supplying device 510 ($510_1$ to $510_n$), moreover, a large number of conductive balls 260 are accommodated in a conductive ball housing box 512 having the individual mask 130 attached to an upper opening, and a plurality of air injecting holes 514 is provided in a bottom part of the conductive ball housing box 512. An air pipe 430 communicates with each of the air injecting holes 514 from a compressor 420.

In the conductive ball supplying device 510 ($510_1$ to $510_n$), compressed air is injected upward from the air injecting hole 514 so that the conductive ball 260 accommodated in each conductive ball housing box 512 passes through a conductive ball inserting hole 132 of the individual mask 130 and is bonded (temporarily) to a flux 254 applied to the pad 112.

A manufacturing method according to the third example will be described with reference to FIGS. 7A to 7E. FIGS. 7A to 7E are views for explaining the manufacturing method (No. 1 to No. 5) according to the third example.

Figure 7A:
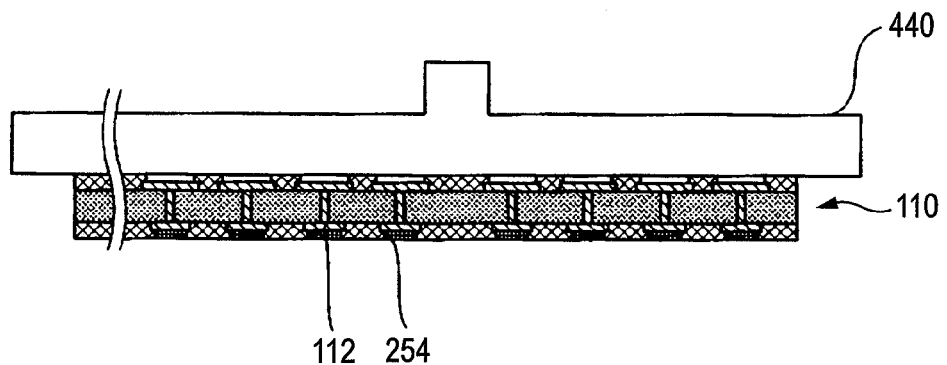
FIG. 7A is a view for explaining a method (No. 1) of manufacturing a substrate according to the third example.

In FIG. 7A, the vacuum chuck 440 to be moved by a delivering device adsorbs the substrate 110 and is moved in this state. The individual mask 130 is not attached to the substrate 110 but a delivery is carried out with upper and lower surfaces inverted in such a manner that the pad 112 is turned on the lower surface side.

Figure 7B:
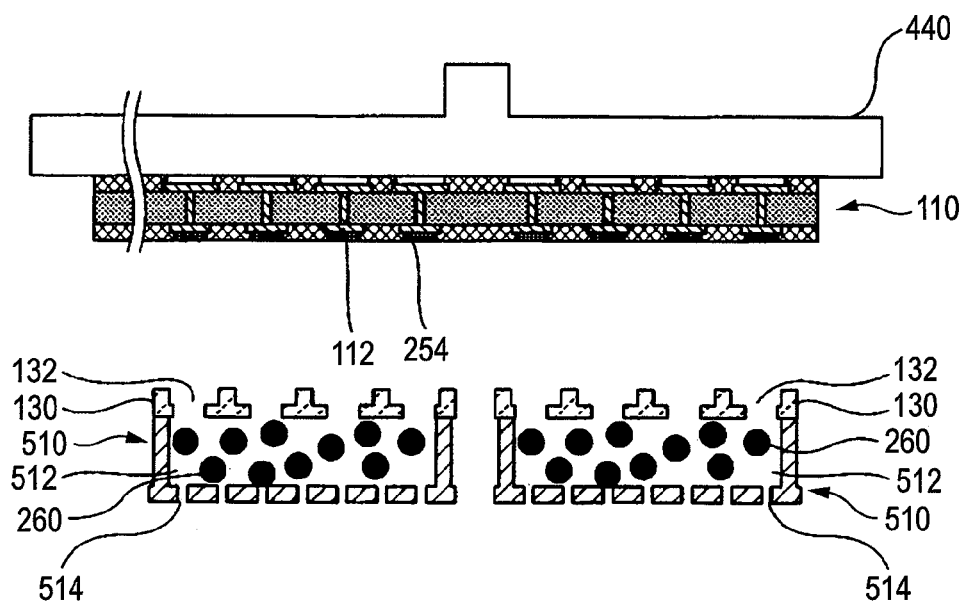
FIG. 7B is a view for explaining a method (No. 2) of manufacturing a substrate according to the third example.

In FIG. 7B, the position of the vacuum chuck 440 is adjusted and the vacuum chuck 440 is thus stopped in such a manner that each pad 112 on the lower surface side of the substrate 110 is coincident with the conductive ball inserting hole 132 of the individual mask 130 ($130_1$ to $130_n$) provided in the conductive ball supplying device 510 ($510_1$ to $510_n$). For the adjustment of the positions of the conductive ball inserting hole 132 and the pad 112, the position (XY coordinate position) of the pad 112 is detected by means of a CCD camera 162 of a pad detecting device 160 and the position (XY coordinate position) of the conductive ball inserting hole 132 is detected by means of a CCD camera 222 of a mask hole detecting device 220 in the same manner as in the first example. Pad position information and mask hole position information which are detected by the CCD cameras 162 and 222 are stored in a storing device 190. By collating the pad position information with the mask hole position information, it is possible to adjust the positions in such a manner that each conductive ball inserting hole 132 of the individual mask 130 ($130_1$ to $130_n$) and each pad 112 are coincident with each other.

Figure 7C:
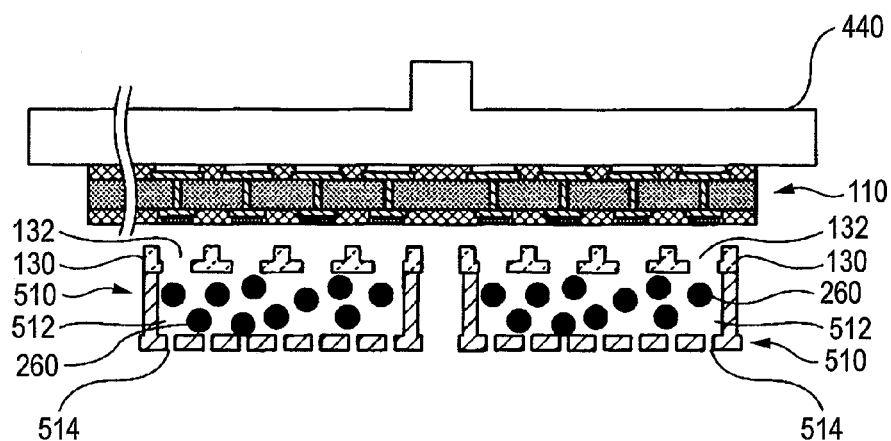
FIG. 7C is a view for explaining a method (No. 3) of manufacturing a substrate according to the third example.

In FIG. 7C, the vacuum chuck 440 drops the lower surface of the substrate 110 to a height position which is close to the individual mask 130 ($130_1$ to $130_n$) of the conductive ball supplying device 510 ($510_1$ to $510_n$) through an operation for dropping the delivering device.

Figure 7D:
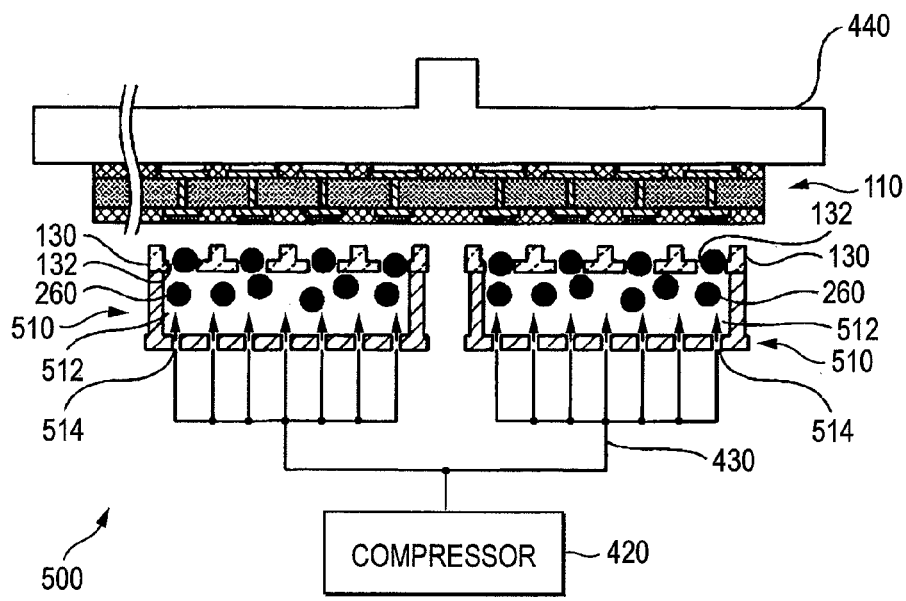
FIG. 7D is a view for explaining a method (No. 4) of manufacturing a substrate according to the third example.

In FIG. 7D, the compressed air generated in the compressor 420 is supplied to the air injecting holes 514 through the air pipe 430. Consequently, the conductive ball 260 accommodated in each of the conductive ball housing boxes 512 of the conductive ball supplying device 510 ($510_1$ to $510_n$) is floated through a flow of the compressed air injected from the air injecting hole 514 and passes through each conductive ball inserting hole 132 of the individual mask 130, and is thus blown toward each pad 112 of the substrate 110.

In the individual mask 130 attached to the conductive ball supplying device 510 ($510_1$ to $510_n$), the position of the conductive ball inserting hole 132 is adjusted to be coincident with that of the pad 112 of the substrate 110 in the same manner as in the first example. Therefore, the conductive ball 260 blown from the conductive ball supplying device 510 ($510_1$ to $510_n$) passes through the conductive ball inserting hole 132 and is bonded (temporarily) to the flux 254 applied to the pad 112.

Figure 7E:
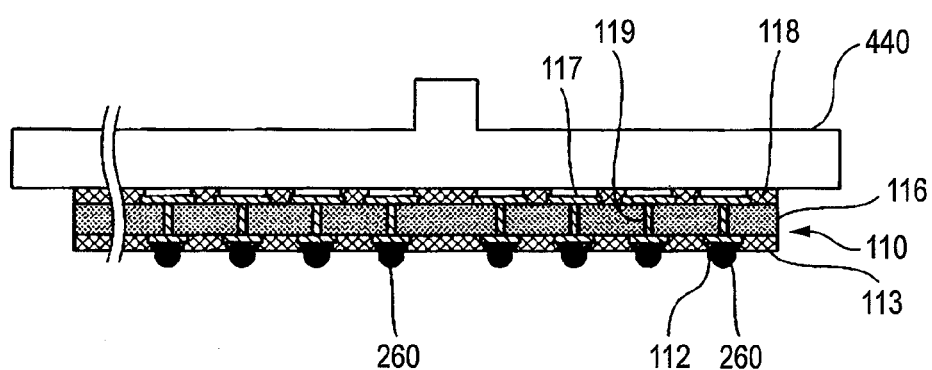
FIG. 7E is a view for explaining a method (No. 5) of manufacturing a substrate according to the third example.

In FIG. 7E, the vacuum chuck 440 separates the substrate 110 from the conductive ball supplying device 510 ($510_1$ to $510_n$) by a delivering operation of the delivering device. In the same manner as in FIGS. 3J to 3L according to the first example, thereafter, the conductive ball 260 is subjected to the reflow to connect a solder bump 262 to the pad 112, and furthermore, the flux 254 is cleaned to make a division into respective wiring boards 310.

In the example, the individual mask 130 ($130_1$ to $130_n$) is attached to the conductive ball supplying device 510 ($510_1$ to $510_n$). Therefore, it is possible to omit the step of removing the individual mask 130 ($130_1$ to $130_n$)

In the third example, thus, the position of the individual mask 130 ($130_1$ to $130_n$) is adjusted and held in such a manner that the individual mask 130 ($130_1$ to $130_n$) is opposed to a whole region 114 ($114_1$ to $114_n$) of the multi-unit substrate 110. Consequently, a productivity can be enhanced, and furthermore, the solder bump 262 can be accurately formed on each pad 112 of the substrate 110. Thus, it is not necessary to fabricate a mask every lot of the substrate 110 differently from the conventional art.

Fourth Example

Figure 8:
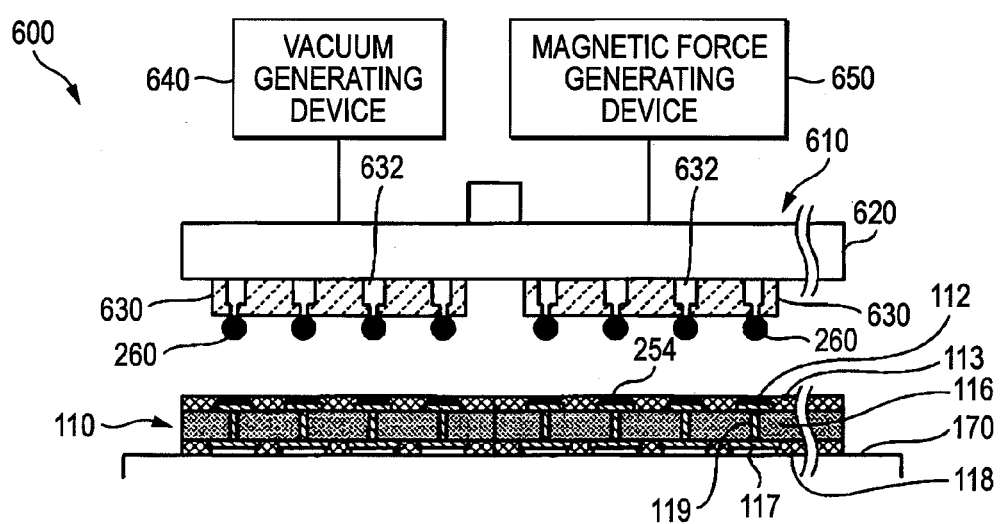
FIG. 8 is a side view showing a substrate manufacturing apparatus according to a fourth example.

FIG. 8 is a side view showing a substrate manufacturing apparatus according to a fourth example. In FIG. 8, the same portions as those in the first to third examples have the same reference numerals and description thereof will be omitted. As shown in FIG. 8, a substrate manufacturing apparatus 600 according to the fourth example is constituted to deliver a conductive ball 260 through a conductive ball delivering device 610 to a pad 112 of a substrate 110 mounted on a table 170.

The conductive ball delivering device 610 has a plurality of individual adsorbing heads (conductive ball supplying members) 630 in order to adsorb the conductive ball 260 to a lower surface of a moving base 620. The moving base 620 has a vacuum generating device 640 for vacuum adsorbing the conductive ball 260 onto an inner part and a magnetic force generating device 650 for magnetically adsorbing the adsorbing head 630.

Each individual adsorbing head 630 is disposed to be opposed to each region 114 of the substrate 110 and is provided with a plurality of sucking holes 632 for sucking the conductive ball 260 into an inner part. The sucking holes 632 are disposed at a corresponding interval to the pads 112 of the substrate 110.

Furthermore, a position of each individual adsorbing head 630 is adjusted in such a manner that a position of each sucking hole 632 is coincident with that of the pad 112 in each region of the substrate 110. When the position of the individual adsorbing head 630 is completely adjusted, the individual adsorbing head 630 is fixed to the moving base 620 by a magnetic force generated by the magnetic force generating device 650.

In a state in which the position of the individual adsorbing head 630 is adjusted corresponding to the pad 112, thus, a vacuum generated by the vacuum generating device 640 is introduced into the sucking hole 632 of the individual adsorbing head 630 and the sucking hole 632 is caused to adsorb the conductive ball 260. An opening of the sucking hole 632 has a smaller diameter than a diameter of the conductive ball 260. For this reason, the conductive ball 260 is adsorbed onto the lower surface of the individual adsorbing head 630 at an equal interval to the pad 112.

The conductive ball delivering device 610 delivers the conductive balls 260 adsorbed onto the lower surface of the individual adsorbing head 630 onto the substrate 110 mounted on the table 170 and carries out a dropping operation to supply the conductive balls 260 to all of the pads 112 of the substrate 110 in a lump. When the conductive ball 260 is bonded (temporarily) to a flux 254 applied to each of the pads 112, the vacuum generating device 640 is stopped to halt the suction of the conductive ball 260 and to then lift the moving base 620.

The conductive ball 260 is supplied to all of the pads 112 of the substrate 110. Thereafter, the substrate 110 is subjected to a reflow so that a solder bump 262 is connected to the pad 112 and the flux 254 is cleaned, and a division into respective wiring boards 310 is subsequently made.

In the fourth example, the position of the individual adsorbing head 630 is adjusted every region 114 in place of an individual mask 130. Consequently, the position of the sucking hole 632 of the individual adsorbing head 630 can easily be caused to be coincident with that of the position of the pad 112 of the substrate 110.

In the fourth example, thus, the position of the individual adsorbing head 630 is adjusted in such a manner that the individual adsorbing head 630 is opposed to the whole region 114 ($114_1$ to $114_n$) of the multi-unit substrate 110. Consequently, a productivity can be enhanced, and furthermore, the solder bump 262 can be accurately formed on each pad 112 of the substrate 110. Thus, it is not necessary to fabricate a mask every lot of the substrate 110 differently from the conventional art.

Fifth Example

Figure 9:
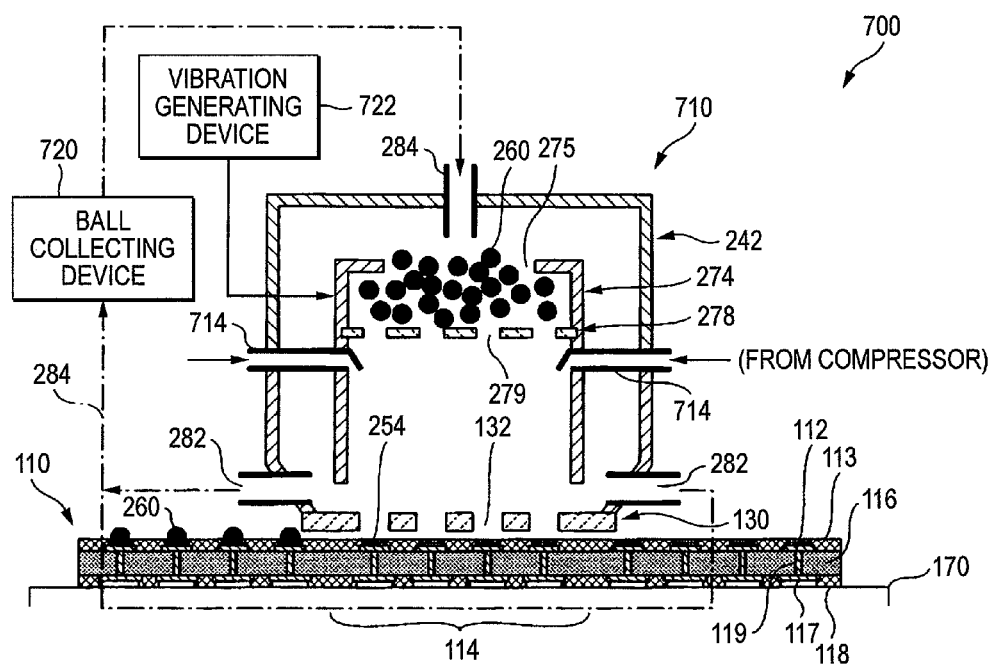
FIG. 9 is a view for explaining a substrate manufacturing apparatus and a substrate manufacturing method (No. 1) according to a fifth example.

FIG. 9 is a side view showing a substrate manufacturing apparatus according to a fifth example. In FIG. 9, the same portions as those in the first to fourth examples have the same reference numerals and description thereof will be omitted. As shown in FIG. 9, a substrate manufacturing apparatus 700 according to the fifth example is constituted to supply a conductive ball 260 to a pad 112 on an upper surface side of a substrate 110 and has a conducive ball supplying device 710. An individual mask 130 is held in a lower opening of the conductive ball supplying device 710.

Moreover, a table 170 includes a vacuum generating device (not shown) for vacuum adsorbing the substrate 110. When the substrate 110 is delivered onto the table 170 through a substrate deliver-in device 150 (see FIG. 2A) and is mounted thereon, a vacuum generated by the vacuum generating device is introduced into an adsorbing passage in the table 170. Consequently, the substrate 110 mounted on the table 170 is adsorbed (fixed) to the table 170.

The conductive ball supplying device 710 has such a structure that an upper part of the multi-unit substrate 110 can be moved in X and Y directions (a horizontal direction) and a Z direction (a vertical direction) through a moving device which is not shown. The conductive ball supplying device 710 has such a structure as to include a head 242, a ball housing portion 274 and the individual mask 130.

The head 242 has a lower opening to which the individual mask 130 is attached. More specifically, in the example, the individual mask 130 has such a structure as to be held in the conductive ball supplying device 710. Moreover, a ball collecting path 282 is connected to a slightly upper position from the position of the head 242 in which the individual mask 130 is held. Furthermore, the ball housing portion 274 for accommodating the conductive ball 260 is provided in the head 242.

The ball housing portion 274 fulfills the function of accommodating the conductive ball 260 therein. An opening portion 275 is formed on an upper surface of the ball housing portion 274. Moreover, a plurality of air injecting holes 714 is provided on a side surface of the ball housing portion 274. The air injecting hole 714 is connected to a compressor 420 (which is the same as that shown in FIG. 4). Accordingly, compressed air generated by the compressor 420 is injected from the air injecting hole 714 into an inner part of the ball housing portion 274.

Furthermore, a sieve 278 is provided between the upper surface of the ball housing portion 274 on which the opening portion 275 is formed and the position in which the air injecting hole 714 is disposed. The sieve 278 has a plurality of sieve holes 279 formed thereon. A diameter of the sieve hole 279 is set to be slightly larger than that of the conductive ball 260 in such a manner that the conductive ball 260 can pass therethrough (can be shaken off). Thus, the sieve hole 279 has the diameter which is slightly larger than the diameter of the conductive ball 260. In the case in which a large number of conductive balls 260 are accommodated in the upper part of the sieve 278 of the ball housing portion 274, therefore, the conductive ball 260 does not directly pass through the sieve hole 279 but is accommodated in the ball housing portion 274 as shown in FIG. 9.

Moreover, the ball housing portion 274 is connected to a vibration generating device 722. The vibration generating device 722 is started to vibrate the ball housing portion 274. Accordingly, the conductive ball 260 accommodated in the upper part of the sieve 278 of the ball housing portion 274 is moved in the ball housing portion 274 through the vibration generating device 722. When the conductive ball 260 enters the position in which the sieve hole 279 is formed with the movement, the conductive ball 260 passes through the sieve hole 279 and is dropped toward the individual mask 130.

The conductive ball 260 which is dropped into the upper part of the individual mask 130 passes through a conductive ball inserting hole 132 of the individual mask 130 and is bonded (temporarily) to a flux 254 applied to the pad 112. In this case, in order to prevent the conductive balls 260 from dropping on the way somewhere, in the example, all of the conductive balls 260 accommodated in the ball housing portion 274 are not supplied to the individual mask 130 at the same time but the ball housing portion 274 is first vibrated to shake off the conductive ball 260 from the sieve 278. Then, the conductive ball 260 thus shaken off passes through the conductive ball inserting hole 132 and is thus bonded (temporarily) to the flux 254 on the pad 112. Accordingly, the conductive ball 260 is smoothly inserted into the conductive ball inserting hole 132. Thus, it is possible to enhance an insertion efficiency and an insertion reliability.

On the other hand, a ball return path 284 is connected to a position of the head 242 which is opposed to the opening portion 275. The ball return path 284 is connected to a ball collecting device 720. The ball collecting device 720 serves to collect any of the conductive balls 260 which is dropped into a lower part of the ball housing portion 274 and is not bonded to the flux 254.

More specifically, the ball collecting device 720 first sucks and collects the conductive ball 260 remaining in the lower part of the ball housing portion 274 through the ball collecting path 282. Subsequently, the ball collecting device 720 discharges the collected conductive ball 260 together with the compressed air toward the ball return path 284. An end of the ball return path 284 is opened toward the opening portion 275 formed on the ball housing portion 274. Accordingly, the conductive ball 260 sent from the ball collecting device 720 is accommodated in the upper position of the sieve 278 of the ball housing portion 274 again. A moving device for moving the ball collecting device 720, the vibration generating device 722 and the conductive ball supplying device 710 has such a structure that a driving operation is controlled by a control device 180 (see FIG. 2A).

A manufacturing method according to the fifth example will be described with reference to FIG. 9 and FIGS. 10A to 10C. FIG. 9 and FIGS. 10A to 10C are views for explaining the manufacturing method (No. 1 to No. 4) according to the fifth example.

The processing described above with reference to FIGS. 3A to 3C is also carried out in the same manner in the example. More specifically, the multi-unit substrate 110 created at a separate step is delivered onto the table 170 through the substrate deliver-in device 150 and is mounted thereon. Then, a vacuum is introduced into a sucking passage in the table 170 through a vacuum generating device 172. Consequently, the substrate 110 is held on the table 170.

When the substrate 110 is mounted on the table 170, a position of the pad 112 arranged on an upper surface side of a region 114 is detected by means of a CCD camera. Moreover, the position of the conductive ball inserting hole 132 of the individual mask 130 provided on the lower opening of the conductive ball supplying device 710 is also detected by means of the CCD camera. Furthermore, the flux 254 is previously disposed on the pad 112 provided on the substrate 110 by using an ink jet nozzle.

When the flux 254 is disposed on the pad 112 as described above, the moving device is started so that the conductive ball supplying device 710 is horizontally moved toward the upper part of the region 114 of the substrate 110 on which the conductive ball 260 is to be disposed. When the movement is carried out up to a position in which the conducive ball inserting hole 132 formed on the individual mask 130 held in the lower part of the head 242 is coincident with the pad 112 of the substrate 110, then, the moving device stops the movement of the conductive ball supplying device 710.

The positions of the conductive ball inserting hole 132 and the pad 112 can be adjusted based on information obtained by detecting the position (XY coordinate position) of the pad 112 through a CCD camera 162 of a pad detecting device 160 and information obtained by detecting the position (XY coordinate position) of the conductive ball inserting hole 132 through a CCD camera 222 of a mask hole detecting device 220 in the same manner as in each of the examples.

When the conductive ball supplying device 710 is moved to a position in which the conductive ball inserting hole 132 and the pad 112 are coincident with each other as described above, the moving device subsequently moves the conductive ball supplying device 710 toward the substrate 110 down to a position in which the individual mask 130 is close to the substrate 110. In this case, the conductive ball supplying device 710 is moved downward (moved vertically) to a position in which the flux 254 of the substrate 110 does not stick to the individual mask 130. FIG. 9 shows a state in which the conductive ball supplying device 710 is moved downward to the predetermined position. The ball collecting device 720, the vibration generating device 722 and the compressor 420 are stopped while the conductive ball supplying device 710 is moved.

When the conductive ball supplying device 710 is positioned on the substrate 110 as described above, the vibration generating device 722 is subsequently started. When the vibration generating device 722 is started, the ball housing portion 274 is vibrated (the head 242 is constituted so as not to be vibrated in this case). Accordingly, the sieve 278 is also vibrated with the vibration of the ball housing portion 274 and only the conductive ball 260 shaken off from the sieve 278 is dropped toward the individual mask 130. Then, the conductive ball 260 dropped into the upper part of the individual mask 130 passes through the conductive ball inserting hole 132 of the individual mask 130 and is bonded (temporarily) to the flux 254 applied to the pad 112.

In this case, in the example, there is employed the structure in which all of the conductive balls 260 accommodated in the ball housing portion 274 are not supplied to the individual mask 130 at the same time but the conductive ball 260 shaken off from the sieve 278 is supplied to the upper part of the individual mask 130, and furthermore, only the conductive ball 260 passing through the conductive ball inserting hole 132 of the individual mask 130 is bonded (temporarily) to the flux 254 applied onto the pad 112. By employing the structure, the conductive ball 260 is smoothly inserted into the conductive ball inserting hole 132. Thus, it is possible to enhance an insertion efficiency and an insertion reliability.

More specifically, in the case in which all of the conductive balls 260 are supplied to the individual mask 130 in a lump as in the conventional art, there is generated a phenomenon in which the smooth movement of the conductive ball 260 positioned in a lower part is inhibited due to a weight of the conductive balls 260 stacked on the upper part and the conductive balls 260 cannot be smoothly introduced into the conductive ball inserting hole 132. By gradually supplying the conductive balls 260 to the individual mask 130, however, it is possible to permit the movement of the conductive ball 260 on the individual mask 130. Consequently, it is possible to enhance an insertion efficiency and an insertion reliability.

Figure 10A:
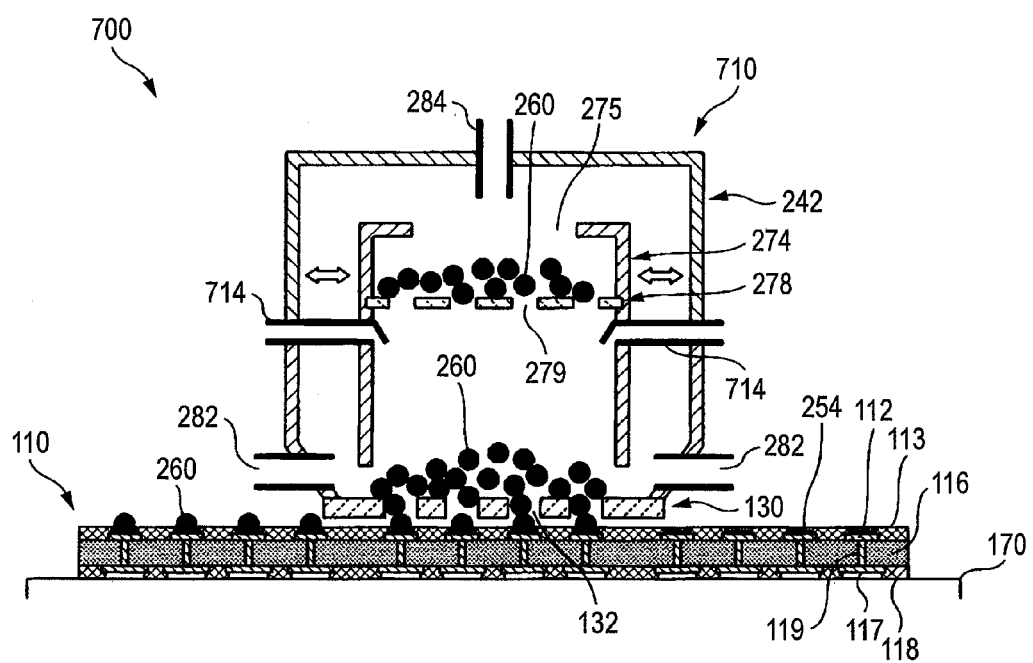
FIG. 10A is a view for explaining a method (No. 2) of manufacturing a substrate according to the fifth example.

FIG. 10A shows a state in which the ball housing portion 274 is vibrated so that the conductive balls 260 are supplied to all of the pads 112 of one of the regions 114 through the conductive ball inserting hole 132 of the individual mask 130. A predetermined time is required for supplying the conductive balls 260 to all of the pads 112. In the meantime, similarly, the ball housing portion 274 is maintained in a vibrating state. For this reason, the conductive balls 260 which pass through the sieve 278 and are not supplied to the pads 112 are left in the upper part of the individual mask 130.

When the supply of the conductive balls 260 to all of the pads 112 is ended as described above, the vibration of the ball housing portion 274 is stopped by the vibration generating device 722, and furthermore, a processing of collecting the conductive balls 260 remaining in the upper part of the individual mask 130 is carried out. In the correction processing, the compressed air generated by the compressor 420 is supplied into the ball housing portion 274 through the air injecting hole 714.

Figure 10B:
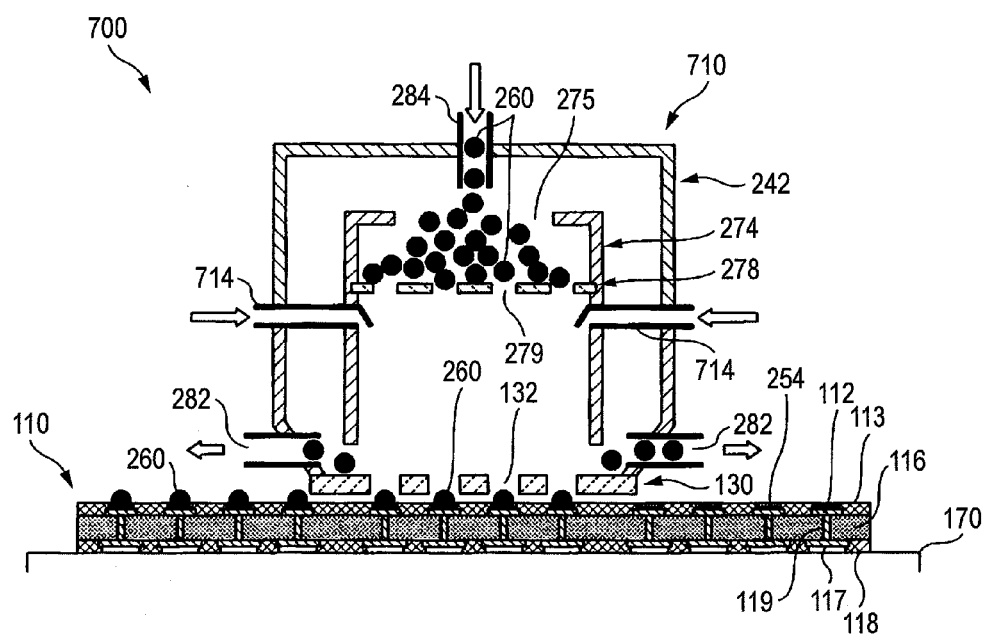
FIG. 10B is a view for explaining a method (No. 3) of manufacturing a substrate according to the fifth example.

At the same time, the ball collecting device 720 sucks and collects the conductive balls 260 remaining in the lower part of the ball housing portion 274 through the ball collecting path 282. FIG. 10B shows a state in which the conductive balls 260 remaining over the individual mask 130 are collected through the ball collecting path 282. In the processing of collecting the conductive balls 260, the compressed air is discharged from the air injecting hole 714. Therefore, the conductive ball 260 is smoothly introduced into the ball collecting path 282. Consequently, the conductive ball 260 can be prevented from remaining in the ball housing portion 274.

The conductive ball 260 collected into the ball collecting device 720 is discharged together with the compressed air toward the ball return path 284. As described above, the end of the ball return path 284 is opened toward the opening portion 275 formed on the ball housing portion 274. Therefore, the conductive ball 260 sent from the ball collecting device 720 is accommodated in the upper position of the sieve 278 of the ball housing portion 274 again.

Figure 10C:
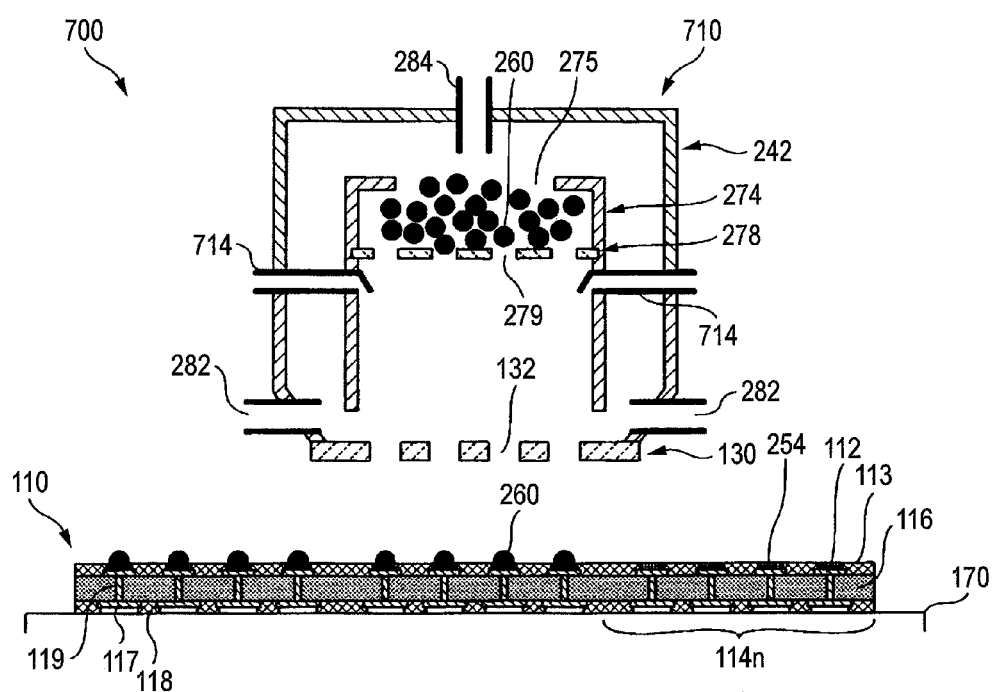
FIG. 10C is a view for explaining a method (No. 4) of manufacturing a substrate according to the fifth example.

When all of the conductive balls 260 remaining on the individual mask 130 are returned to the ball housing portion 274, the device for moving the conductive ball supplying device 710 is started to first lift the conductive ball supplying device 710 apart from the substrate 110 as shown in FIG. 10C. Subsequently, the moving device moves the conductive ball supplying device 710 to a region in which the conductive ball 260 is not provided (for example, a region indicated as 114, in FIG. 10C). There is repetitively executed the same processing of bonding the conductive ball 260 to the flux 254 on the pad 112 as described above.

When the processing of supplying the conductive balls 260 to all of the regions 114 ($114_1$ to $114_n$) on the substrate 110 is ended, the conductive ball 260 is subjected to a reflow to form a solder bump 262 on the pad 112, and furthermore, to clean the flux 254, thereby making a division into respective wiring boards 310.

In the example, the individual mask 130 is attached to the conductive ball supplying device 710 and the conductive ball 260 is supplied to the predetermined region 114 on the substrate 110 by the movement of the conductive ball supplying device 710. Therefore, it is not necessary to prepare large numbers of individual masks 130 and conductive ball supplying devices. Consequently, it is possible to reduce a cost of manufacturing equipment.

Sixth Example

Figure 11A:
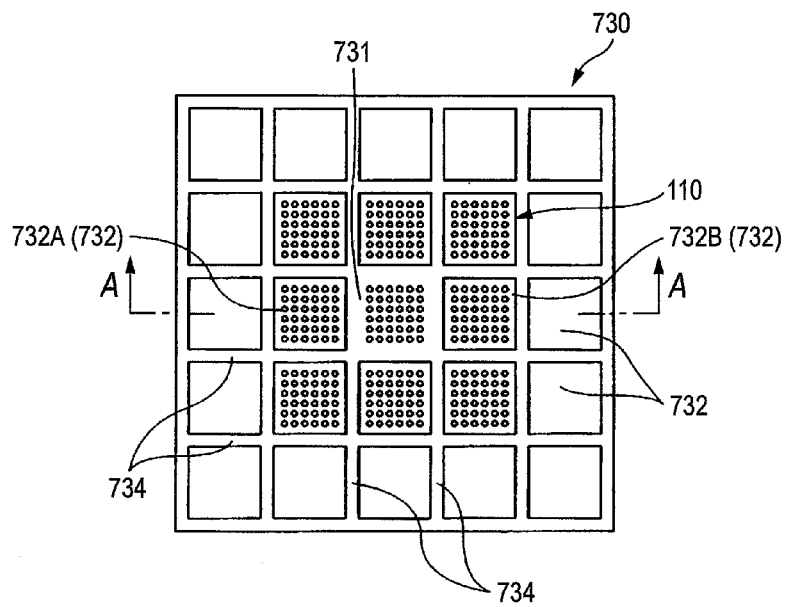
FIG. 11A is a view for explaining a method of manufacturing a substrate according to a sixth example.
Figure 11B:
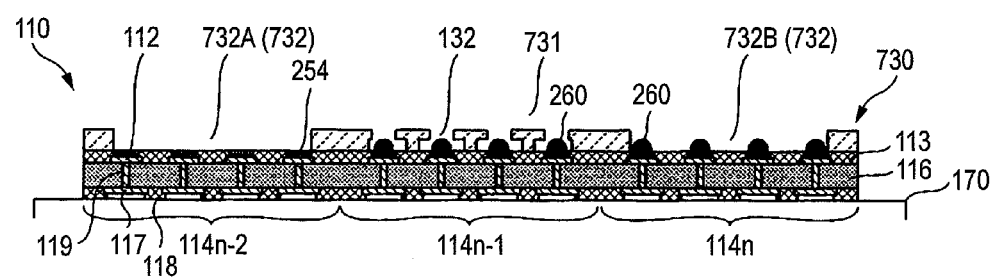
FIG. 11B is a sectional view taken along an A-A line in FIG. 11A.

FIGS. 11A and 11B are views for explaining a substrate manufacturing apparatus according to a sixth example. In FIGS. 11A and 11B, the same portions as those in the first to fifth examples have the same reference numerals and description thereof will be omitted. In the example, moreover, an individual mask 730 to be a conductive ball supplying member has a feature. For convenience of description and illustration, therefore, each drawing shows only a substrate 110 and the individual mask 730 and the other structures are neither shown nor described.

The individual mask 730 to be used in the substrate manufacturing apparatus according to the example has an area set to be larger than an area of a region 114 formed on the substrate 110. Moreover, the individual mask 730 has such a structure that a plurality of frames 734 is combined like a grid and a ball supplying portion 731 having a conductive ball inserting hole 132 formed thereon is provided in a central part thereof. By the combination of the frames 734 like a grid, thus, a plurality of opening portions 732 is formed on the individual mask 730.

The opening portion 732 is constituted to have a shape and a size which are equal to those of each of the regions 114 (regions $114_1$ to $114_n$) provided in the substrate 110. When the ball supplying portion 731 is positioned in the region 114 of the substrate 110 to which a conductive ball 260 is to be supplied, accordingly, the other regions 114 are opposed to the opening portions 732.

The function of the opening portion 732 which is adjacent to the ball supplying portion 731 of the individual mask 730 will be described with reference to FIG. 11B. In the following description, it is assumed that the opening portions 732 positioned on left and right sides in the ball supplying portion 731 in each drawing are indicated as 732A and 732B respectively.

As shown in FIG. 11B, in a state in which the individual mask 730 is positioned and disposed on the substrate 110, the conductive ball inserting hole 132 of the ball supplying portion 731 is maintained to be opposed to a pad 112 formed in the region $114_{n-1}$ of the substrate 110. When the conductive ball 260 is supplied from the conductive ball inserting hole 132 in the positioning state, accordingly, the conductive ball 260 is bonded to the pad 112 through a flux 254.

In the positioning state, the region $114_{n-2}$ of the substrate 110 is opposed to the opening portion 732A of the individual mask 730 and the region $114_n$ is opposed to the opening portion 732B. In the example, the flux 254 is applied to the pad 112 in the region $114_{n-2}$ and the conductive ball 260 has already been bonded to the pad 112 in the region $114_n$.

By an attachment of the individual mask 730 according to the example to the substrate 110, there is obtained a structure in which the region $114_{n-2}$ having the flux 254 applied thereto and the region $114_n$ having the conductive ball 260 attached thereto are surrounded by the frame 734 constituting the individual mask 730. Consequently, the opening portion 732A of the individual mask 730 functions as an opening for relieving the flux 254 which is applied and the opening portion 732B functions as an opening for relieving the conductive ball 260 which has already been supplied. In the supply (loading) of the conductive ball 260 to the region $114_{n-1}$, accordingly, the individual mask 730 or the conductive ball supplying device 240, 410, 510, 610 or 710 can be prevented from coming in contact with the pad 112 or the conductive ball 260 which has already been supplied. Thus, it is possible to enhance a reliability of the substrate 110 to be manufactured (the flux 254 and the conductive ball 260 correspond to an object to be loaded onto a pad according to claims).

Seventh Example

Figure 12A:
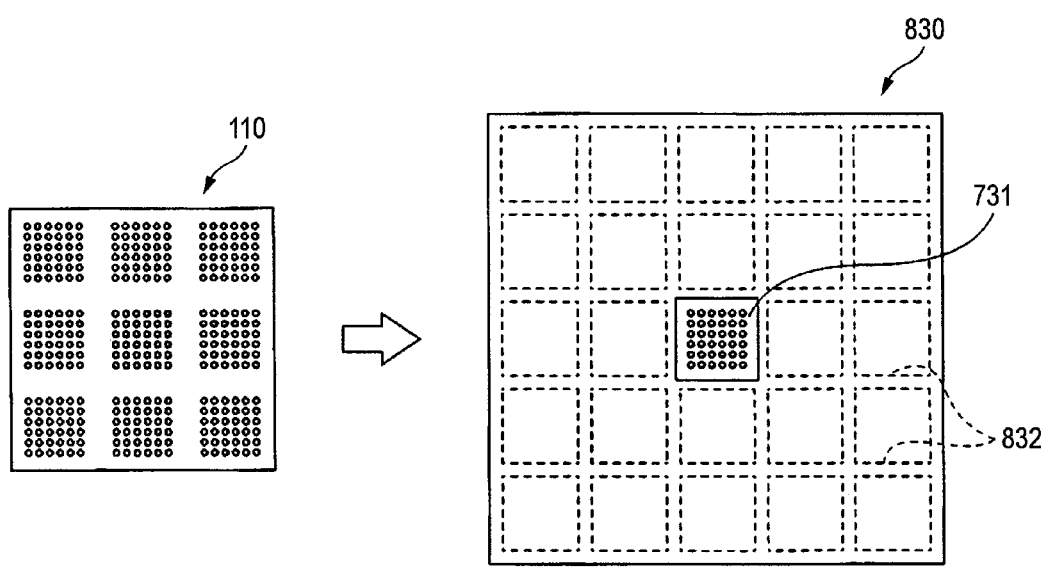
FIG. 12A is a view for explaining a method (No. 1) of manufacturing a substrate according to a seventh example.
Figure 12B:
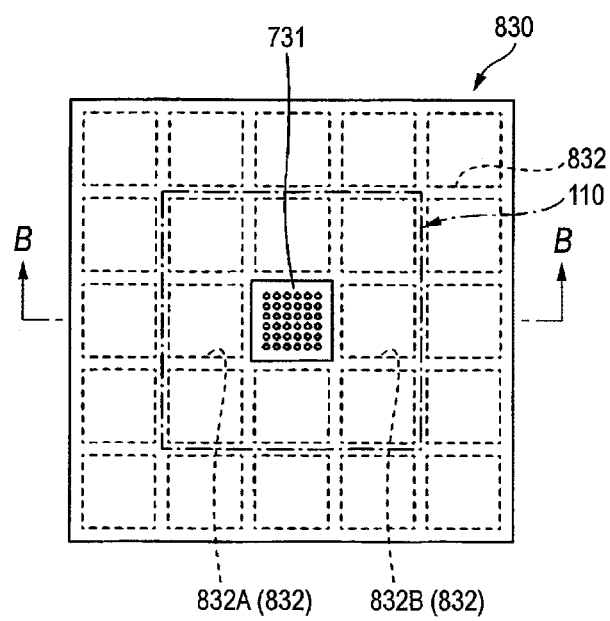
FIG. 12B is a view for explaining a method (No. 2) of manufacturing a substrate according to the seventh example.
Figure 12C:
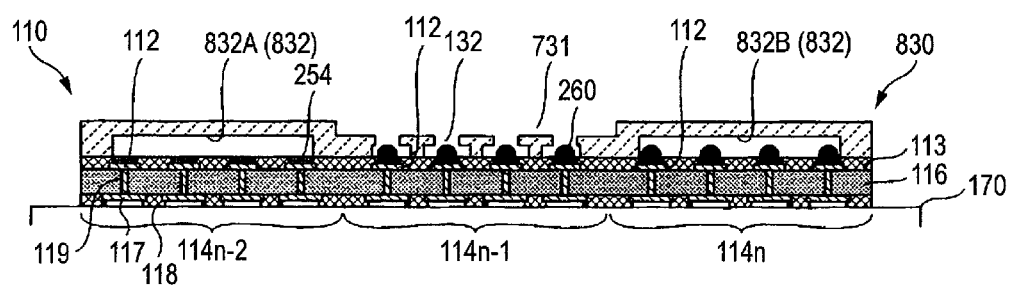
FIG. 12C is a sectional view taken along a B-B line in FIG. 12B.

FIGS. 12A to 12C are views for explaining a substrate manufacturing apparatus according to a seventh example. In FIGS. 12A to 12C, the same portions as those in the first to sixth examples have the same reference numerals and description thereof will be omitted. Also in the example, an individual mask 830 to be a conductive ball supplying member has a feature. For convenience of description and illustration, therefore, each drawing shows only a substrate 110 and the individual mask 830 and the other structures are neither shown nor described.

In the individual mask 730 according to the sixth example, the frame 734 is combined like a grid to form an opening portion 732 (732A, 732B) in at least the adjacent positions to the ball supplying portion 731 and they are used for relieving a flux 254 and a conductive ball 260. On the other hand, in the example, a plurality of concave portions 832 is formed on the individual mask 830 to fulfill the same function as the individual mask 730 according to the sixth example.

FIG. 12A shows a state in which the individual mask 830 has not been attached to the substrate 110, and FIG. 12B shows a state in which the individual mask 830 is attached to the substrate 110. The concave portion 832 formed on the individual mask 830 is constituted to have a shape and a size which are equal to those of each of regions 114 (regions $114_1$ to $114_n$) provided in the substrate 110. When the ball supplying portion 731 is positioned in the region 114 of the substrate 110 to which a conductive ball 260 is to be supplied, accordingly, the other regions 114 are opposed to each corresponding concave portion 832 of the individual mask 830.

In the positioning state, the region $114_{n-2}$ of the substrate 110 is opposed to a concave portion 832A of the individual mask 830 and the region $114_n$ is opposed to a concave portion 832B. As shown in FIG. 12C, also in the example, the flux 254 is applied to a pad 112 in the region $114_{n-2}$ and the conductive ball 260 has already been bonded to the pad 112 in the region $114_n$.

By an attachment of the individual mask 830 according to the example to the substrate 110, there is obtained a structure in which the region $114_{n-2}$ having the flux 254 applied thereto and the region $114n$ having the conductive ball 260 bonded thereto are covered with the concave portion 832 constituting the individual mask 830. Consequently, the concave portion 832A of the individual mask 830 functions as a relief portion of the flux 254 which is applied and the concave portion 832B functions as an opening for relieving the conductive ball 260 which has already been supplied. Also in the example, in the supply (loading) of the conductive ball 260 to the region $114_n$, the individual mask 830 or the conductive ball supplying device 240, 410, 510, 610 or 710 can be therefore prevented from coming in contact with the pad 112 or the conductive ball 260 which has already been supplied. Thus, it is possible to enhance a reliability of the substrate 110 to be manufactured.

As shown in FIG. 12C, in the example, the regions $114_{n-2}$ and $114_n$ of the substrate 110 are not exposed but are perfectly covered with the individual mask 830 differently from the sixth example. Therefore, the flux 254 and the conductive ball 260 can be protected more reliably so that a higher reliability can be realized.

Eighth Example

Figure 13:
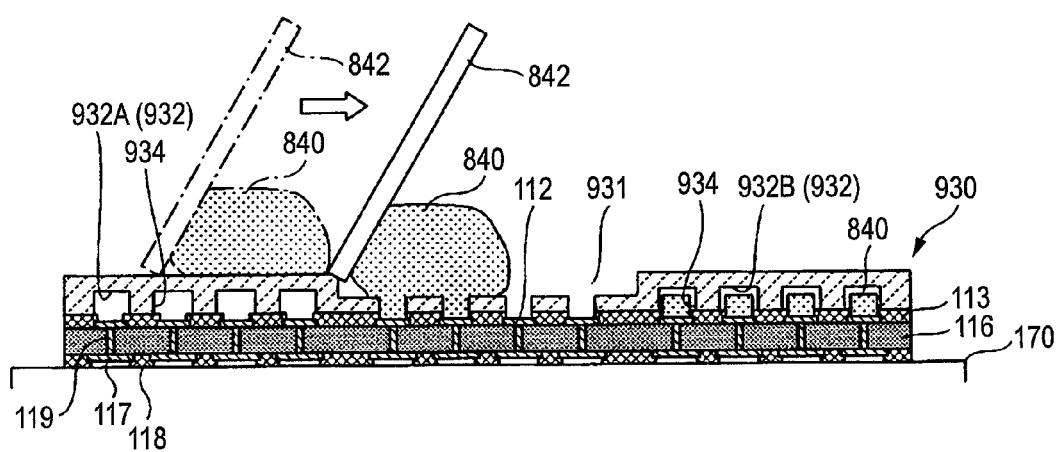
FIG. 13 is a view for explaining a method of manufacturing a substrate according to an eighth example.

FIG. 13 is a view for explaining a substrate manufacturing apparatus according to an eighth example. In FIG. 13, the same portions as those in the first to seventh examples have the same reference numerals and description thereof will be omitted. Also in the example, an individual mask 930 to be a conductive ball supplying member has a feature. For convenience of description and illustration, therefore, each drawing shows only a substrate 110 and the individual mask 930 and the other structures are neither shown nor described.

In the examples, the individual masks 130, 730 and 830 are used for supplying the conductive ball 260 to the substrate 110. On the other hand, the example features that the individual mask 930 is used as a screen printing plate and a squeegee 842 is used to carry out screen printing a cream solder 840 on a pad 112.

The individual mask 930 has an identical basic structure to that of the individual mask 830 according to the seventh example. However, the squeegee 842 is moved while pressing an upper surface. Therefore, a column portion 934 for a reinforcement is provided in a concave portion 932 (932A, 932B) and is constituted to abut on the substrate 110. Consequently, it is possible to increase a strength of the individual mask 930 and to prevent the individual mask 930 from being deformed or broken even if the squeegee 842 is moved over the upper surface.

INDUSTRIAL APPLICABILITY

While the description has been given by taking, as an example, the substrate on which the resin material is laminated in the examples, it is a matter of course that the invention is not restricted to the manufacture of the wiring board but can be applied to a multi-unit substrate such as a silicon substrate.

What is claimed is:

1. A method of manufacturing a substrate comprising the steps of:
supplying a conductive ball to each of a plurality of pads formed on a surface of a multi-unit substrate, and
dividing the substrate into regions having a predetermined size, wherein
a plurality of conductive ball supplying masks, each having a plurality of holes corresponding to the pads included in one of the regions in the surface of the substrate is opposed to the respective region of the substrate,
a position of each conductive ball supplying mask is individually adjusted in such a manner that the holes are coincident with the pads included in the respective region, and
each of the holes of each conductive ball supplying mask is utilized to supply the conductive ball to the pad of the substrate.

2. The method of manufacturing a substrate according to claim 1, wherein
each conductive ball supplying mask has an area opposed to the region of the substrate, and is held in a close state to the region of the substrate after the alignment is completed.

3. The method of manufacturing a substrate according to claim 1, wherein
the position of each conductive ball supplying mask is adjusted in such a manner that each of the holes is coincident with each of the pads formed in the respective region of the substrate,
each conductive ball supplying mask is held on an upper surface of the substrate, and
the conductive ball is inserted into each of the holes from above.

4. The method of manufacturing a substrate according to claim 1, wherein
the position of each conductive ball supplying mask is adjusted in such a manner that each of the holes is coincident with each of the pads formed in the respective region of the substrate,
each conductive ball supplying mask is held on a lower surface of the substrate, and
the conductive ball is inserted into each of the holes from below.

5. The method of manufacturing a substrate according to claim 1, wherein
the conductive ball is supplied to the pad through each of the holes of each conductive ball supplying mask by a conductive ball supplying device disposed to be opposed to a respective conductive ball supplying mask.

6. The method of manufacturing a substrate according to claim 5, wherein
the conductive ball supplying device comprises the conductive ball supplying masks provided to be opposed to the upper or lower surface of the substrate, and supplies the conductive ball to the pad of the substrate through each of the holes of the conductive ball supplying masks.

7. The method of manufacturing a substrate according to claim 1, wherein
each conductive ball supplying mask is provided with a plurality of vacuum holes opposed to one of the regions of the substrate, and delivers the conductive ball sucked into the vacuum holes to a position opposed to the pad in the region of the substrate, and then supplies the conductive ball to the pad of the substrate.

8. The method of manufacturing a substrate according to claim 5, wherein
the conductive ball supplying masks are held in the conductive ball supplying device.

9. The method of manufacturing a substrate according to claim 1, wherein
an area of each conductive ball supplying mask is set to be larger than that of the respective region, and
a frame portion having openings for preventing an interference with the conductive ball or flux to be loaded onto the pad is provided in a position adjacent to a region in which a plurality of holes corresponding to the pad is formed.

10. The method of manufacturing a substrate according to claim 1, wherein
a flux is applied to the pad, and
the conductive ball is bonded to the pad through the flux.

* * * * *